(12) United States Patent
Jones et al.

(10) Patent No.: US 11,796,589 B1
(45) Date of Patent: Oct. 24, 2023

(54) THERMAL HEAD FOR INDEPENDENT CONTROL OF ZONES

(71) Applicant: AEM Holdings Ltd., Singapore (SG)

(72) Inventors: Thomas P. Jones, Escondido, CA (US); Samer Kabbani, Laguna Niguel, CA (US); Chan See Jean, Singapore (SG); Paul R. Hoffman, San Diego, CA (US)

(73) Assignee: AEM Holdings Ltd., Singapore (SG)

( * ) Notice: Subject to any disclaimer, the term of this patent is extended or adjusted under 35 U.S.C. 154(b) by 0 days.

(21) Appl. No.: 17/971,505

(22) Filed: Oct. 21, 2022

(51) Int. Cl.
*G01R 31/28* (2006.01)
*H05B 1/02* (2006.01)

(52) U.S. Cl.
CPC ....... *G01R 31/2875* (2013.01); *H05B 1/0233* (2013.01); *H05B 2203/005* (2013.01)

(58) Field of Classification Search
CPC ............ G01R 31/2874; G01R 31/2875; G01R 31/2877
See application file for complete search history.

(56) References Cited

U.S. PATENT DOCUMENTS

| | | | |
|---|---|---|---|
| 5,325,052 A | 6/1994 | Yamashita | |
| 6,389,225 B1 | 5/2002 | Malinoski et al. | |
| 6,498,899 B2 | 12/2002 | Malinoski et al. | |
| 6,549,026 B1 | 4/2003 | Dibattista et al. | |
| 6,583,638 B2 | 6/2003 | Costello et al. | |
| 6,617,868 B1 * | 9/2003 | Needham ........... | G01R 31/2879 324/750.09 |
| 6,668,570 B2 | 12/2003 | Wall et al. | |
| 6,711,904 B1 | 3/2004 | Law et al. | |
| 6,774,661 B1 | 8/2004 | Tustaniwskyj et al. | |
| 6,825,681 B2 | 11/2004 | Feder et al. | |
| 6,862,405 B2 | 3/2005 | Malinoski et al. | |
| 6,985,000 B2 | 1/2006 | Feder et al. | |

(Continued)

FOREIGN PATENT DOCUMENTS

| | | |
|---|---|---|
| JP | 2001210683 A | 8/2001 |
| TW | 1784539 B | 11/2022 |

OTHER PUBLICATIONS

Notice of Allowance dated Jan. 31, 2023, for U.S. Appl. No. 18/048,831, filed Oct. 21, 2022, eight pages.

(Continued)

*Primary Examiner* — Tung X Nguyen
(74) *Attorney, Agent, or Firm* — MORRISON & FOERSTER LLP

(57) ABSTRACT

Disclosed herein are thermal heads and corresponding test systems for independently controlling a one or more components while testing one or more devices under test. In some embodiments, a thermal head comprises a plurality of adapters, one or more heaters, and one or more thermal controllers for independently controlling temperatures of the components. The thermal controllers may control the temperatures of at least some of the components independently such that thermal control of one component does not affect the thermal control of the other component. In some embodiments, the thermal control is by way of one or more cold plates, and the thermal head comprises one or more cold plates. Embodiments of the disclosure further include independent control of one or more forces using one or more force mechanisms.

30 Claims, 18 Drawing Sheets

(56) References Cited

U.S. PATENT DOCUMENTS

| | | |
|---|---|---|
| 6,992,500 B2 | 1/2006 | Sugiyama et al. |
| 7,042,240 B2 | 5/2006 | Lopez et al. |
| 7,311,782 B2 | 12/2007 | Strang et al. |
| 7,355,428 B2 | 4/2008 | Kabbani et al. |
| 7,436,059 B1 | 10/2008 | Ouyang |
| 7,626,407 B2 | 12/2009 | Kabbani |
| 7,663,388 B2 | 2/2010 | Barabi et al. |
| 8,289,040 B2 | 10/2012 | Komoto et al. |
| 8,343,280 B2 | 1/2013 | Iimuro |
| 8,772,682 B2 | 7/2014 | Ambal et al. |
| 8,891,235 B2 | 11/2014 | Walczyk et al. |
| 8,896,335 B2 | 11/2014 | Stuckey et al. |
| 8,927,907 B2 | 1/2015 | Fink et al. |
| 9,046,569 B2 | 6/2015 | Kirby et al. |
| 9,291,667 B2 | 3/2016 | Armstrong et al. |
| 9,307,578 B2 | 4/2016 | Pease |
| 9,347,987 B2 | 5/2016 | Schroeder et al. |
| 9,360,502 B2 | 6/2016 | Crippen et al. |
| 9,377,486 B2 | 6/2016 | Song et al. |
| 9,400,291 B2 | 7/2016 | Johnson et al. |
| 9,494,353 B2 | 11/2016 | Yu et al. |
| 9,709,622 B2 | 7/2017 | Lopez et al. |
| 9,713,345 B2 | 7/2017 | Farine et al. |
| 9,869,714 B2 | 1/2018 | Johnson et al. |
| 10,056,225 B2 | 8/2018 | Gaff et al. |
| 11,039,528 B2 | 6/2021 | Tustaniwskyj et al. |
| 11,340,283 B2 | 5/2022 | Kasal et al. |
| 11,454,666 B2 | 9/2022 | Chan et al. |
| 11,493,551 B2 | 11/2022 | Ranganathan et al. |
| 11,567,119 B2 | 1/2023 | Kabbani et al. |
| 11,656,272 B1 | 5/2023 | Jones et al. |
| 11,674,999 B2 | 6/2023 | Kabbani et al. |
| 11,693,051 B1 | 7/2023 | Jones et al. |
| 2002/0118032 A1 | 8/2002 | Norris et al. |
| 2003/0155939 A1 | 8/2003 | Lutz et al. |
| 2005/0151553 A1 | 7/2005 | Kabbani et al. |
| 2005/0224492 A1 | 10/2005 | Roy |
| 2006/0164111 A1 | 7/2006 | Lopez et al. |
| 2007/0138166 A1 | 6/2007 | Fennewald et al. |
| 2010/0042355 A1 | 2/2010 | Aube et al. |
| 2011/0132000 A1* | 6/2011 | Deane ............... F25B 21/04 62/3.3 |
| 2013/0285686 A1* | 10/2013 | Malik ............. G01R 31/2875 324/750.05 |
| 2014/0139246 A1 | 5/2014 | Chuang et al. |
| 2014/0262129 A1 | 9/2014 | Li et al. |
| 2019/0385925 A1 | 12/2019 | Walczyk et al. |
| 2020/0411408 A1 | 12/2020 | Walczyk et al. |
| 2021/0325453 A1 | 10/2021 | Chan et al. |
| 2022/0107360 A1 | 4/2022 | Kabbani et al. |
| 2022/0137092 A1 | 5/2022 | Ranganathan et al. |
| 2022/0137129 A1 | 5/2022 | Ranganathan et al. |
| 2022/0155364 A1 | 5/2022 | Kabbani et al. |
| 2022/0178991 A1 | 6/2022 | Kabbani et al. |
| 2022/0187361 A1 | 6/2022 | Kabbani et al. |
| 2022/0206061 A1 | 6/2022 | Ranganathan et al. |
| 2022/0276301 A1 | 9/2022 | Kabbani et al. |
| 2022/0284982 A1 | 9/2022 | Ranganathan et al. |

OTHER PUBLICATIONS

Notice of Allowance dated Apr. 10, 2023, for U.S. Appl. No. 18/048,836, filed Oct. 21, 2022, eight pages.

Notice of Allowance dated May 2, 2023, for U.S. Appl. No. 18/048,831, filed Oct. 21, 2022, seven pages.

Non-Final Office Action dated Mar. 20, 2023, for U.S. Appl. No. 18/048,833, filed Oct. 21, 2022, fifteen pages.

Notice of Allowance (corrected) dated Mar. 8, 2023, for U.S. Appl. No. 18/048,831, filed Oct. 21, 2022, five pages.

Non-Final Office Action dated Jan. 13, 2023, for U.S. Appl. No. 18/048,836, filed Oct. 21, 2022, ten pages.

Notice of Allowance dated Jun. 1, 2023, for U.S. Appl. No. 18/048,833, filed Oct. 21, 2022, seven pages.

Notice of Allowance (corrected) dated Jun. 16, 2023, for U.S. Appl. No. 18/048,833, filed Oct. 21, 2022, three pages.

Notice of Allowance dated Jul. 11, 2023, for U.S. Appl. No. 18/311,164, filed May 2, 2023, eight pages.

* cited by examiner

Section A-A

Section B-B

Section B-B

Section A-A

THERMAL HEAD FOR INDEPENDENT CONTROL OF ZONES

FIELD

The present disclosure relates to a test system comprising a thermal head capable of independently controlling a plurality of zones while testing a device.

BACKGROUND

Integrated circuit (IC) chips are typically fabricated with a plurality of identical copies on a semiconductor wafer. After wafer fabrication has been completed, the wafer may be cut or diced to separate the individual IC chips. These IC chips (also referred to as a device) may then be tested (referred to as a device under test (DUT)). The testing may involve electrical testing (burn-in tests, open- and short-circuit tests, device functional tests, system level tests, etc.), where the performance (e.g., functionality, speed, reliability, etc.) of an IC chip may be measured by a test system to determine whether the IC chip meets one or more performance metrics. For example, electrical test signals may be communicated to and/or from the IC chip to measure its performance. If an IC chip meets the performance metrics, then it may be assembled into a package. The package may be used for multiple purposes such as providing environmental protection and electrical contacts from the IC chip to a system board, among others. These packages may be tested. In some instances, the testing at the package level is similar to the testing at the chip level.

The performance of a DUT may be compared to a target performance, such as the performance of a reference device or another device, or according to a specification. One factor that may cause the performance of a DUT to deviate or fail prematurely while being tested may be its temperature. To ensure that any deviations in the performance of a DUT is not due to temperature, the DUT's temperature may be controlled during testing. It may be important that the temperature of the DUT remain constant and at a set point temperature (or within a given range). While under test, thermal energy may be exchanged between the DUT and components that are thermally coupled to it. A DUT's temperature may be controlled via a heatsink or cold plate that is thermally coupled to the DUT. Thermal coupling may occur when there is sufficient contact between the cold plate and the DUT and/or any intermediate layers.

Advances in technology, such as process nodes, have led to more difficult and expensive wafer fabrication. For example, technologies involving 9 nm or below may require extreme ultraviolet (EUV) fabrication techniques for critical mask layers. It may be difficult to design and fabricate advanced types of IC chips (e.g., system-on-chip (SOC) at the wafer level), particularly when a multitude of functions are involved. In some instances, different package designs may be developed or utilized. For example, a plurality of IC chips, a bare mix of IC chips, pre-packaged IC chips, etc., may be packaged together into a device. Different types of advanced packages, such as system-in-package (SiP), multi-chip module (MCM), stacked die, heterogeneous integration package, etc., have already been developed and are becoming more complex structurally and functionally. In some instances, the devices comprise an increasing number of components in the same size or more compact packaging, causing the components to be within close proximity to each other. The close proximity may make it difficult to control the temperatures of the components if not accounted for, as the temperature of a component may be affected by the temperature of a neighboring component.

Some of the devices (a chip or a package) may comprise a plurality of zones, where each zone may comprise one or more components (e.g., IC chips that are components in a package may each comprise a zone). For example, a complex SOC may comprise a plurality of components such as graphic processing unit (GPU) cores, a plurality of central processing unit (CPU) cores, and various interfaces and other functions, which are segmented into a plurality of zones in the device. In some instances, the components in a device under test may have different properties such as height, surface area, stacked vs. non-stacked, etc., and as such, a test system having a single adapter or a plurality of adapters with the same properties may not sufficiently thermally couple to the components (e.g., due to insufficient contact). In some instances, the components may dissipate different amounts of power while under testing conditions due to different functions of and/or tests being performed on the zones. It may be beneficial to keep the temperature of the components constant and at the same set point temperature (or within a given range) while the device is being tested. A test system may not account for the different amounts of power dissipation. What is needed is a test system capable of independent control of one or more properties (e.g., temperature, applied force, movement, etc.) for different components in a device or devices under test. What is needed is a test system capable of independently controlling components that are within close proximity to each other.

SUMMARY

Disclosed herein are thermal heads and corresponding test systems for independently controlling a plurality of zones (e.g., one or more components) while testing one or more devices under test. In some embodiments, a thermal head comprises a plurality of adapters, one or more heaters, and one or more thermal controllers for independently controlling temperatures of the components. For example, two components may have different set point temperatures. The thermal controllers may control the temperatures of the two components independently such that thermal control of one component does not affect the thermal control of the other component. At a given time, a first heater (thermally coupled to the first component) may be heating the first component, while the temperature of the second component may remain the same. In some embodiments, the thermal control is by way of one or more cold plates, and the thermal head comprises one or more cold plates. As one non-limiting example, at a given time, a first component is being cooled by a cold plate, whereas the second component is not. As yet another example, a third component may not be thermally coupled to a heater and/or cold plate. Embodiments of the disclosure include independent control of one or more forces using one or more force mechanisms.

A test system for testing one or more devices under test is disclosed. The test system comprises: a thermal head for controlling one or more temperatures of the one or more devices under test, the thermal head comprising: a plurality of adapters thermally coupled to one or more components of the one or more devices under test; and one or more heaters thermally coupled to the plurality of adapters and the one or more components of the one or more devices under test, wherein the one or more heaters are configured to heat the one or more components of the one or more devices under test; and one or more thermal controllers configured to independently control the one or more temperatures of the one or more components of the one or more devices under test. Additionally or alternatively, in some embodiments, at least two of the one or more components have different set point temperatures. Additionally or alternatively, in some embodiments, the one or more temperatures of the one or more components are independently controlled using different changes in temperature. Additionally or alternatively, in some embodiments, the one or more heaters comprise a first heater and a second heater and the one or more components comprise a first component and a second component, wherein the first heater is configured to heat the first component, and the second heater is configured to heat the second component. Additionally or alternatively, in some embodiments, the thermal head further comprises one or more temperature sensors configured to measure temperatures of the one or more heaters or the plurality of adapters, wherein the one or more thermal controllers control the one or more temperatures based on the measured temperatures. Additionally or alternatively, in some embodiments, an update frequency of the one or more thermal controllers for independently controlling the one or more temperatures of the one or more components is less than 200 microseconds. Additionally or alternatively, in some embodiments, the one or more heaters comprise a heater including at least two heating elements, wherein the thermal head further comprises: a thermal insulator located between the at least two heating elements. Additionally or alternatively, in some embodiments, the thermal insulator comprises a material having through-holes or trenches. Additionally or alternatively, in some embodiments, the thermal head further comprises: a thermal interface material located on at least one side of at least one of the one or more heaters. Additionally or alternatively, in some embodiments, the thermal head further comprises: a thermal interface material located on at least one side of at least one of the plurality of adapters. Additionally or alternatively, in some embodiments, the plurality of adapters comprises a first adapter thermally coupled to a first thermal interface material layer and a second adapter thermally coupled to a second thermal interface material layer, wherein a thermal resistance of the first thermal interface material layer is different from a thermal resistance of the second thermal interface material layer. Additionally or alternatively, in some embodiments, the first thermal interface material layer has a greater surface area than the second thermal interface material layer. Additionally or alternatively, in some embodiments, the second thermal interface material layer comprises openings or holes. Additionally or alternatively, in some embodiments, at least one of the one or more heaters contacts at least one of the one or more components. Additionally or alternatively, in some embodiments, at least one of the one or more heaters is attached to at least one of the plurality of adapters. Additionally or alternatively, in some embodiments, the at least one heater comprises a plurality of pins that allow the at least one heater to attach to the at least one adapter. Additionally or alternatively, in some embodiments, the plurality of pins is attached to the at least one adapter by soldering, welding, brazing, press fitting, or conductive adhesive. Additionally or alternatively, in some embodiments, a surface area of at least one of the one or more heaters is the same as a surface area of a corresponding adapter. Additionally or alternatively, in some embodiments, at least one of the one or more heaters and a corresponding adapter comprise mating alignment features for aligning the at least one heater and the corresponding adapter. Additionally or alternatively, in some embodiments, the one or more components of the one or more devices under test comprise a first component and a second component, and the plurality of adapters comprises a first adapter and a second adapter, wherein the first component is thermally coupled to the first adapter and the second component is thermally coupled to the second adapter. Additionally or alternatively, in some embodiments, the one or more thermal controllers control the one or more temperatures of the one or more components based on amounts of power from the one or more components. Additionally or alternatively, in some embodiments, the amounts of power from the one or more components comprise amounts of expected power dissipation. Additionally or alternatively, in some embodiments, the thermal head further comprises: one or more cold plates thermally coupled to at least one of the plurality of adapters, wherein the one or more cold plates are configured to cool the at least one adapter. Additionally or alternatively, in some embodiments, the one or more cold plates are independently controlled. Additionally or alternatively, in some embodiments, the thermal head further comprises: one or more force mechanisms configured to apply force to at least one of the one or more components. Additionally or alternatively, in some embodiments, the one or more force mechanisms are independently controlled. Additionally or alternatively, in some embodiments, at least two of the one or more components have different heights. Additionally or alternatively, in some embodiments, at least one of the plurality of adapters is thermally coupled to at least two of the one or more components. Additionally or alternatively, in some embodiments, each of the plurality of adapters is thermally coupled to a unique one of the one of the one or more components. Additionally or alternatively, in some embodiments, the one or more components are part of a single device under test.

A test system for testing one or more devices under test is disclosed. The test system comprises: a thermal head for controlling one or more temperatures of the one or more devices under test, the thermal head comprising: a plurality of adapters thermally coupled to one or more components of the one or more devices under test; and one or more cold plates thermally coupled to the plurality of adapters, wherein the one or more cold plates are configured to cool the plurality of adapters; and one or more thermal controllers configured to independently control the one or more temperatures of the one or more components of the one or more devices under test. Additionally or alternatively, in some embodiments, at least two of the one or more components have different set point temperatures. Additionally or alternatively, in some embodiments, the one or more temperatures of the one or more components are independently controlled using different changes in temperature. Additionally or alternatively, in some embodiments, the one or more cold plates comprise a first cold plate and a second cold plate, and the plurality of adapters comprise a first adapter and a second adapter, wherein the first cold plate is configured to cool the first adapter and the second cold plate configured to cool the second adapter. Additionally or alternatively, in some embodiments, at least two of the plurality of adapters are thermally coupled to the same cold plate. Additionally or alternatively, in some embodiments, at least one of the plurality of adapters contacts at least one of the one or more cold plates. Additionally or alternatively, in some embodiments, the at least one cold plate has a surface area that is the same as a surface area of the at least one adapter. Additionally or alternatively, in some embodiments, the one or more thermal controllers set, adjust, or maintain temperatures of the one or more cold plates by setting, adjusting, or maintaining a flow rate or temperature of a liquid or a gas associated with the one or more cold plates. Additionally or alternatively, in some embodiments, an update frequency of the one or more thermal controllers for independently controlling the one or more temperatures of the one or more components is less than 200 microseconds. Additionally or alternatively, in some embodiments, the thermal head further comprises: a thermal interface material located on at least one side of at least one of the one or more cold plates. Additionally or alternatively, in some embodiments, the thermal head further comprises: a thermal interface material located on at least one side of at least one of the plurality of adapters. Additionally or alternatively, in some embodiments, the plurality of adapters comprise a first adapter thermally coupled to a first thermal interface material layer and a second adapter thermally coupled to a second thermal interface material layer, wherein a thermal resistance of the first thermal interface material layer is different from a thermal resistance of the second thermal interface material layer. Additionally or alternatively, in some embodiments, the first thermal interface material layer has a greater surface area than the second thermal interface material layer. Additionally or alternatively, in some embodiments, the second thermal interface material layer comprises openings or holes. Additionally or alternatively, in some embodiments, the one or more components of the one or more devices under test comprise a first component and a second component and the plurality of adapters comprise a first adapter and a second adapter, wherein the first component is thermally coupled to the first adapter and the second component is thermally coupled to the second adapter. Additionally or alternatively, in some embodiments, the one or more thermal controllers control the one or more temperatures of the one or more components based on amounts of power from the one or more components. Additionally or alternatively, in some embodiments, the amounts of power from the one or more components comprise amounts of expected power dissipation. Additionally or alternatively, in some embodiments, at least two of the one or more components have different amounts of power dissipation. Additionally or alternatively, in some embodiments, the thermal head further comprises: one or more heaters thermally coupled to at least one of the one or more components, wherein the one or more heaters are configured to heat the at least one component. Additionally or alternatively, in some embodiments, the one or more heaters are independently controlled. Additionally or alternatively, in some embodiments, the thermal head further comprises: one or more force mechanisms configured to apply force to at least one of the one or more components. Additionally or alternatively, in some embodiments, the one or more force mechanisms are independently controlled. Additionally or alternatively, in some embodiments, the one or more force mechanisms contact at least one of the one or more cold plates. Additionally or alternatively, in some embodiments, at least one of the plurality of adapters is thermally coupled to at least two of the one or more components. Additionally or alternatively, in some embodiments, each of the plurality of adapters is thermally coupled to a unique one of the one of the one or more components. Additionally or alternatively, in some embodiments, the one or more components are part of a single device under test.

A test system for testing one or more devices under test is disclosed. The test system comprises: a thermal head for controlling one or more temperatures of the one or more devices under test, the thermal head comprising: a plurality of adapters thermally coupled to one or more components of the one or more devices under test; and one or more force mechanisms configured to apply one or more forces to the one or more components of the one or more devices under test; and a force controller configured to independently control the one or more forces applied to the one or more components of the one or more devices under test. Additionally or alternatively, in some embodiments, at least two of the one or more components are tested with different applied forces. Additionally or alternatively, in some embodiments, the one or more force mechanisms comprise one or more force applicators that apply the one or more forces to the one or more components. Additionally or alternatively, in some embodiments, the one or more force applicators comprise: a pneumatic or hydraulic cylinder, a pneumatic or hydraulic diaphragm, a stepper motor, a linear motor, a server motor, an electroactive polymer actuator, a shape memory alloy actuator, an electromagnetic actuator, a rotary motor, an electromechanical actuator, a piezoelectric actuator, or a voice coil. Additionally or alternatively, in some embodiments, the one or more force mechanisms comprise one or more pushers, wherein the one or more force applicators push the one or more pushers such that the one or more devices under test are moved toward a socket. Additionally or alternatively, in some embodiments, at least one of the one or more force mechanisms applies a force greater than 2 kgf. Additionally or alternatively, in some embodiments, the one or more force mechanisms comprise a first force mechanism and a second force mechanism, and the plurality of adapters comprises a first adapter and a second adapter, wherein the first force mechanism applies a first force to the first adapter and the second force mechanism applies a second force to the second adapter. Additionally or alternatively, in some embodiments, the one or more force mechanisms comprise one or more transducers configured to measure forces, wherein the force controller sets, adjusts, or maintains the one or more applied forces based on the measured forces. Additionally or alternatively, in some embodiments, the one or more force mechanisms comprise one or more force applicators, wherein the one or more force applicators are controlled based on differences between the measured forces and target forces. Additionally or alternatively, in some embodiments, the one or more transducers comprise: a pneumatic load cell, a hydraulic load cell, an inductive load cell, a capacitive load cell, a magnetorestrictive device, a strain gauge-based sensor, a force sensitive resistor, a thin film device, or a piezoelectric device. Additionally or alternatively, in some embodiments, the thermal head further comprises: one or more cold plates, wherein the one or more transducers contact the one or more cold plates. Additionally or alternatively, in some embodiments, at least one of the one or more force mechanisms comprises a spring. Additionally or alternatively, in some embodiments, at least one of the one or more force mechanisms comprises a piston, a ramp, and a roller, wherein movement of the piston causes movement of the ramp, which adjusts an amount of force applied by the roller. Additionally or alternatively, in some embodiments, at least one of the one or more force mechanisms comprises a cam and a roller, wherein rotation of the cam adjusts an amount of force applied by the roller. Additionally or alternatively, in some embodiments, at least one of the one or more forces is a variable force that is different at the beginning of the test and during the test, or during the test and at the end of the test. Additionally or alternatively, in some embodiments, at least one of the one or more forces is a fixed force that is the same at the beginning of the test and during the test, or during the test and at the end of the test. Additionally or alternatively, in some embodiments, at least one of the one or more force mechanisms applies force to at least two of the one or more components. Additionally or alternatively, in some embodiments, the test system further comprises: a testing force mechanism configured to move the one or more devices under test towards a socket for electrically coupling the one or more devices under test to the socket. Additionally or alternatively, in some embodiments, the testing force mechanism comprises a force applicator configured to apply a force greater than 10 kgf. Additionally or alternatively, in some embodiments, the thermal head further comprises: one or more heaters thermally coupled to at least one of the one or more components, wherein the one or more heaters are configured to heat the at least one component. Additionally or alternatively, in some embodiments, the one or more heaters are independently controlled. Additionally or alternatively, in some embodiments, the thermal head further comprises: one or more cold plates thermally coupled to at least one of the plurality of adapters, wherein the one or more cold plates are configured to cool the at least one adapter. Additionally or alternatively, in some embodiments, the one or more cold plates are independently controlled. Additionally or alternatively, in some embodiments, the one or more thermal controllers control the one or more temperatures of the one or more components based on amounts of power from the one or more components. Additionally or alternatively, in some embodiments, the amounts of power from the one or more components comprise amounts of expected power dissipation. Additionally or alternatively, in some embodiments, at least two of the one or more components have different amounts of power dissipation. Additionally or alternatively, in some embodiments, at least two of the one or more components have different heights. Additionally or alternatively, in some embodiments, at least one of the plurality of adapters is thermally coupled to at least two of the one or more components. Additionally or alternatively, in some embodiments, each of the plurality of adapters is thermally coupled to a unique one of the one of the one or more components. Additionally or alternatively, in some embodiments, the one or more components are part of a single device under test.

A test system for testing one or more devices under test is disclosed. The test system comprises: a thermal head for controlling one or more temperatures of the one or more devices under test, the thermal head comprising: a plurality of adapters thermally coupled to one or more components of the one or more devices under test, wherein the plurality of adapters comprises a first adapter and a second adapter, and movement of the first adapter is independent from movement of the second adapter; and a controller configured to independently control one or more properties of the plurality of adapters. Additionally or alternatively, in some embodiments, the one or more properties comprise temperature or force. Additionally or alternatively, in some embodiments, the plurality of adapters comprises a first adapter having a first height and a second adapter having a second height. Additionally or alternatively, in some embodiments, the plurality of adapters comprises a first adapter having a first thermal mass and a second adapter having a second thermal mass. Additionally or alternatively, in some embodiments, the plurality of adapters comprises a first adapter having a first surface area thermally coupled to a corresponding one or more components and a second adapter having a second surface area thermally coupled to corresponding one or more components. Additionally or alternatively, in some embodiments, at least two of the plurality of adapters are configured to thermally couple to the one or more components on the same side of a substrate of the one or more devices under test. Additionally or alternatively, in some embodiments, at least two of the plurality of adapters are configured to thermally couple to the one or more components on different sides of a substrate of the one or more devices under test. Additionally or alternatively, in some embodiments, the plurality of adapters comprises a first adapter nested within a second adapter. Additionally or alternatively, in some embodiments, the plurality of adapters comprises a first adapter and a second adapter, wherein the thermal head further comprises: a first heater thermally coupled to the first adapter and a second heater thermally coupled to the second adapter, wherein the first heater is nested within the second heater. Additionally or alternatively, in some embodiments, the plurality of adapters comprises a first adapter and a second adapter, wherein the thermal head further comprises: a first thermal interface material layer thermally coupled to the first adapter and a second thermal interface material layer thermally coupled to the second adapter, wherein the first thermal interface material layer is nested within the second thermal interface material layer. Additionally or alternatively, in some embodiments, the first adapter is thermally coupled to a first component and the second adapter is thermally coupled to a second component, and wherein movement of the second component is not independent from movement of the first component. Additionally or alternatively, in some embodiments, the one or more components comprise stacked components. Additionally or alternatively, in some embodiments, the first adapter is thermally coupled to a first component of the stacked components and the second adapter is thermally coupled to a second component of the stacked components, wherein a height of the first adapter is less than a height of the second adapter. Additionally or alternatively, in some embodiments, the first adapter is thermally coupled to a first component of the stacked components and the second adapter is thermally coupled to a second component of the stacked components, wherein a force applied by the first adapter is less than a force applied by the second adapter. Additionally or alternatively, in some embodiments, the thermal head further comprises: one or more heaters thermally coupled to at least one of the one or more components, wherein the one or more heaters are configured to heat the at least one component. Additionally or alternatively, in some embodiments, the one or more heaters comprise a first heater coupled to a first adapter and a second heater coupled to a second adapter, wherein movement of the first heater is independent from movement of the second heater. Additionally or alternatively, in some embodiments, at least one of the one or more heaters contacts at least one of the plurality of adapters. Additionally or alternatively, in some embodiments, the one or more heaters are independently controlled. Additionally or alternatively, in some embodiments, the thermal head further comprises: one or more cold plates thermally coupled to at least one of the plurality of adapters, wherein the one or more cold plates are configured to cool the at least one adapter. Additionally or alternatively, in some embodiments, the one or more cold plates comprise a first cold plate coupled to a first adapter and a second cold plate coupled to a second adapter, wherein movement of the first cold plate is independent from movement of the second cold plate. Additionally or alternatively, in some embodiments, at least one of the one or more cold plates contacts at least one of the plurality of adapters. Additionally or alternatively, in some embodiments, the one or more cold plates are independently controlled. Additionally or alternatively, in some embodiments, the thermal head further comprises: one or more force mechanisms configured to apply one or more forces to at least one of the one or more components. Additionally or alternatively, in some embodiments, the one or more force mechanisms are independently controlled. Additionally or alternatively, in some embodiments, at least two of the one or more components have different set point temperatures. Additionally or alternatively, in some embodiments, at least two of the one or more components have different amounts of power dissipation. Additionally or alternatively, in some embodiments, at least two of the one or more components are tested with different applied forces. Additionally or alternatively, in some embodiments, at least two of the one or more components have different heights. Additionally or alternatively, in some embodiments, at least one of the plurality of adapters is thermally coupled to at least two of the one or more components. Additionally or alternatively, in some embodiments, the one or more components are part of a single device under test.

It will be appreciated that any of the variations, aspects, features, and options described in view of the systems and methods apply equally to the methods and vice versa. It will also be clear that any one or more of the above variations, aspects, features, and options can be combined. It should be understood that the invention is not limited to the purposes mentioned above, but may also include other purposes, including those that can be recognized by one of ordinary skill in the art.

Figure 1A:
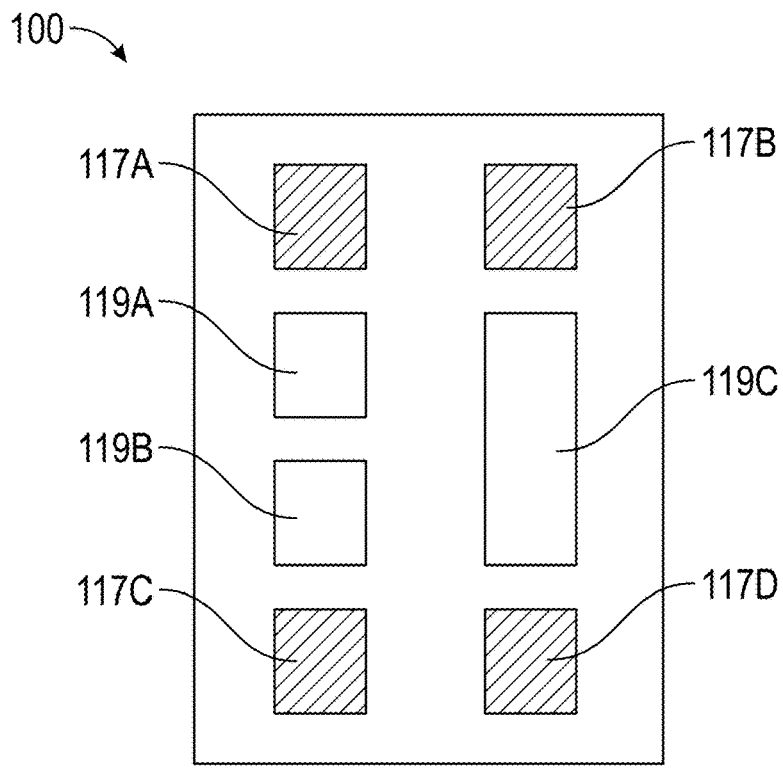
FIG. 1A illustrates a top view of an example chip comprising a plurality of zones.

It will be appreciated that any of the variations, aspects, features, and options described in view of the systems apply equally to the methods and vice versa. It will also be clear that any one or more of the above variations, aspects, features, and options can be combined.

DETAILED DESCRIPTION

Disclosed herein are thermal heads and corresponding test systems for independently controlling a plurality of zones (e.g., one or more components) while testing one or more devices under test. In some embodiments, a thermal head comprises a plurality of adapters, one or more heaters, and one or more thermal controllers for independently controlling temperatures of the components. For example, two components may have different set point temperatures. The thermal controllers may control the temperatures of the two components independently such that thermal control of one component does not affect the thermal control of the other component. At a given time, a first heater (thermally coupled to the first component) may be heating the first component, while the temperature of the second component may remain the same. In some embodiments, the thermal control is by way of one or more cold plates, and the thermal head comprises one or more cold plates. As one non-limiting example, at a given time, a first component is being cooled by a cold plate, whereas the second component is not. As yet another example, a third component may not be thermally coupled to a heater and/or cold plate. Embodiments of the disclosure include independent control of one or more forces using one or more force mechanisms. Embodiments of the disclosure further include methods for operation thereof.

The following description is presented to enable a person of ordinary skill in the art to make and use various embodiments. Descriptions of specific devices, techniques, and applications are provided only as examples. These examples are being provided solely to add context and aid in the understanding of the described examples. It will thus be apparent to a person of ordinary skill in the art that the described examples may be practiced without some or all of the specific details. Other applications are possible, such that the following examples should not be taken as limiting. Various modifications in the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

Various techniques and process flow steps will be described in detail with reference to examples as illustrated in the accompanying drawings. In the following description, numerous specific details are set forth in order to provide a thorough understanding of one or more aspects and/or features described or referenced herein. It will be apparent, however, to a person of ordinary skill in the art, that one or more aspects and/or features described or referenced herein may be practiced without some or all of these specific details. In other instances, well-known process steps and/or structures have not been described in detail in order to not obscure some of the aspects and/or features described or referenced herein.

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combination of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. It will also be understood that the term "same," when used in this specification, refers to the stated feature as being identical or within a certain range (e.g., 1%, 5%, etc.) from identical.

Some of the devices may comprise a plurality of zones, where each zone may comprise one or more components (e.g., IC chips in a package or functional blocks in a chip). FIG. 1A illustrates a top view of an example chip comprising a plurality of zones. Device 100 may comprise zones 117A, 117B, 117C, 117D, 119A, 119B, and 119C. For example, a complex SOC device may comprise a plurality of graphic processing unit (GPU) cores, a plurality of central processing unit (CPU) cores, and various interfaces and other functions, where zones 119A, 119B, and 119C may be high-power zones (e.g., comprising GPU and/or CPU cores), and zones 117A, 117B, 117C, and 117D may be low-power zones (e.g., comprising memory, transceivers, etc.). A zone may comprise one or more components. In some embodiments, at least two zones of a device may dissipate different amounts of power while under testing conditions due to different functions of and/or tests being performed on the zones. It may be beneficial to keep the temperature of one or more zones constant and at one or more set point temperatures (or within a given range) while the device is being tested.

A zone may comprise one or more components, such as zone 117A comprising one component, and zone 119C comprising at least two components. One or more components may be part of a single device (as shown in the figure), or alternatively, part of a plurality of devices under test (not shown in the figure).

Figure 1B:
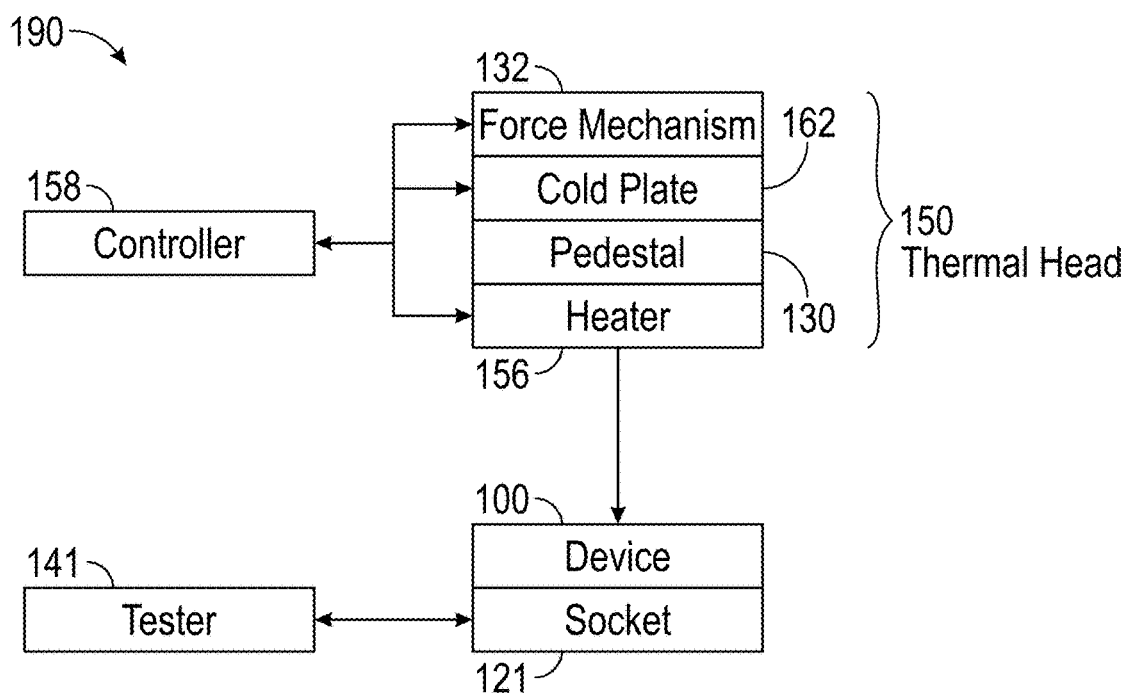
FIG. 1B illustrates a block diagram of an example test system, according to some embodiments.

FIG. 1B illustrates a block diagram of an example test system, according to some embodiments. Test system 190 may comprise a thermal head 150, a controller 158, a socket 121, and a tester 141. The thermal head 150 may be configured to thermally control the device under test 100. The thermal head 150 may comprise one or more of: an adapter 130, a heater 156, a cold plate 162, or a force mechanism 132. The adapter 130 may be configured to allow thermal energy to transfer to and/or from thermally-coupled components. For example, the adapter 130 may allow thermal energy (e.g., heat) to transfer from the heater 156 located on the bottom side of the adapter 130 to the cold plate 162 located on the top side of the adapter 130. The heater 156 may be configured to raise the temperature (e.g., heat) of the device 100, and the cold plate 162 may be configured to lower the temperature (e.g., cool) of the device 100. The thermal head's ability and speed at thermally controlling the temperature of the device 100 may depend on the thermal coupling between its components and the device 100.

The force mechanism 132 may be configured to apply a force to the device 100 to enhance the thermal coupling between the thermal head 150 and the device 100. The controller 158 may be configured to send one or more signals to the thermal head 150 to control one or more of its components. For example, the controller 158 may send a current or voltage signal to the heater 156 to cause it to heat the device 100. As another example, the controller 158 may send a current or voltage signal to a valve metering the flow inside the cold plate 162 or associated chiller to cause it to cool down the device 100. Additionally or alternatively, the controller 158 may send a current or voltage signal to cause the force mechanism 132 to apply more or less force to the thermal head 150, thereby improving the thermal coupling between the thermal head 150 and the device 100 without damaging it. As one non-limiting example, the thermal controller may be a field-programmable gate array (FGPA)-based proportional-integral-derivative (PID) controller.

The socket 121 may be configured to electrically couple power connections and/or test signals from the tester 141 to the device 100, or from the device 100 to the tester 141. The tester 141 may send test signals and/or receive response signals for determining the performance of the device 100. In some embodiments, the tester 141 may monitor the power being supplied to one or more of: the DUT, a component, or zones of the DUT. Although the figure illustrates the test system 190 as comprising one or more components, embodiments of the disclosure may include additional components, or one or more components may not be included. Additionally or alternatively, although one configuration of the test system is shown, embodiments of the disclosure may comprise other configurations such as the thermal head comprising an additional adapter located on the bottom side of the device 100.

Example Thermal Head Comprising a Plurality of Adapters

Figure 2A:
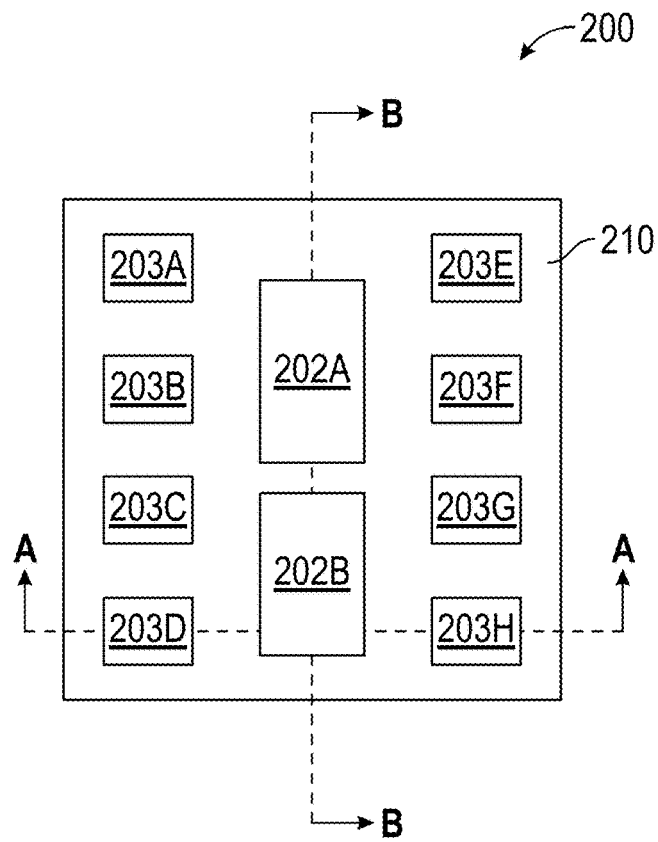
FIG. 2A illustrates a top view of an example device comprising a plurality of zones, according to some embodiments.

FIG. 2A illustrates a top view of an example device comprising a plurality of zones, according to some embodiments. Device 200 may comprise a plurality of components, such as component 202A, component 202B, and components 203A-H mounted on a substrate 210. The device 200 may comprise one or more high-power components (e.g., components 202), one or more low-power components (e.g., components 203), or a combination thereof. In some embodiments, the device 200 may comprise any type of component (e.g., chips or packages); non-limiting examples include logic, RF, analog, digital, power, diodes (e.g., light emitting diodes (LEDs)), sensors (e.g., image sensors), microelectromechanical systems (MEMS), integrated passive devices (IPDs), power management units or integrated circuits (PMUs, PMICs), etc. Additionally or alternatively, the device 200 may comprise other types of components including, but not limited to, resistors, capacitors, inductor, transistors, etc.

As one non-limiting example, the device 200 may be a SiP device used for high performance computing (HPC) applications. Component 202A and component 202B may be processor chips (e.g., CPU and/or GPU chips) surrounded by dynamic random access memory (DRAM) chips, for example. The memory chips may be individual chips, packaged chips, through-silicon via (TSV) stacked chips (e.g., high bandwidth memory (HBM) devices), or the like. In some embodiments, one or more components may be located in close proximity to one or more other components. For example, memory chips may be placed close to the processor chips to reduce signal delays and noise in the memory to processor interconnections, improving overall performance due to, e.g., higher transfer speeds and reduced latency. The close proximity may cause the temperature from one component to affect the temperature of another component.

Figure 2B:
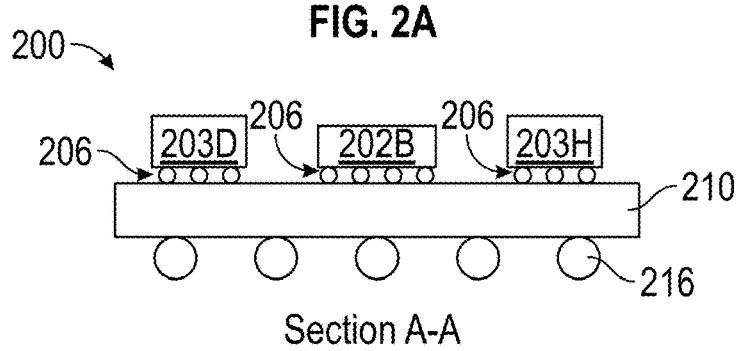
FIG. 2B illustrates a cross-sectional view of the device along line A-A, as drawn in FIG. 2A.

FIG. 2B illustrates a cross-sectional view of the device 200 along line A-A, as drawn in FIG. 2A. Line A-A may be drawn through components 202B, 203D, and 203H. The components 202B, 203D, and 203H may be mounted on and connected to the substrate 210 by way of interconnects 206. In some embodiments, the components in a device 200 may be on a single layer of the substrate 210. In some embodiments, the interconnects 206 may be component interconnects, such as solder balls, copper pillar bumps, C4 (controlled collapse chip connection) bumps, gold bumps, wire bonding, or conductive adhesive, as non-limiting examples. The interconnects 206 may allow the components to be mechanically and/or electrically connected to the substrate 210. The substrate 210 may comprise any type of material, such as laminate. In some embodiments, the substrate 210 may comprise one or more layers of: conductive traces, conductive plane layers, dielectric layers, or a combination thereof. One or more vias may be used to connect conductive layers. The layer(s) and/or vias may be formed using a printed circuit board process. Embodiments of the disclosure may include other materials (e.g., ceramic, silicon, glass, molding compound, etc.) for creating the substrate 210.

The components 202/203 and interconnects 206 may be located on the top side of the substrate 210, and interconnects 216 may be located on the bottom side of the substrate 210. In some embodiments, no components may be located on the bottom side of the substrate 210. The interconnects 216 may be, for example, used to electrically couple the device 200 to a board. The board may be a test board, when the device 200 is being tested, or a system board, when the device is being used in a final product. When coupled to a test board, the interconnects 216 may electrically couple to a socket used to send test signals between a tester and the device 200. The interconnects 216 may be solder balls, pins, leads, pads on the substrate 210, or other forms of interconnects.

As one non-limiting example, the test board may send one or more test (input) signals to the device 200 and/or may receive one or more output signals from the device 200. The test signal(s) may have a predetermined pattern. The output signal(s) may represent the electrical characteristics of the device 200 in response to applying the test signal(s) to the device 200 while being tested. In some embodiments, the testing may be performed using multiple sets of input and output signals, while operating the device 200 under the same or different conditions (e.g., different temperatures).

Figure 2C:
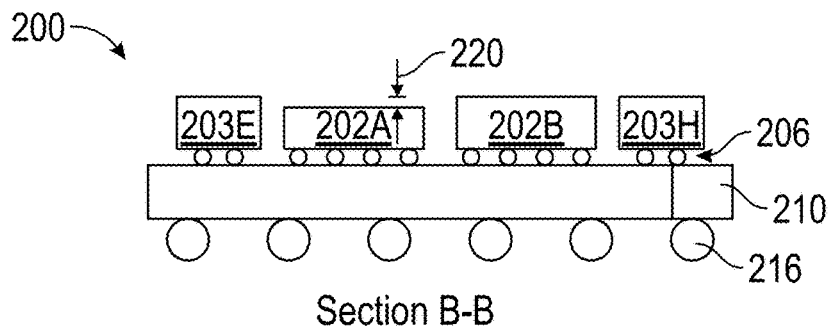
FIG. 2C illustrates a cross-sectional view of the device along line B-B, as drawn in FIG. 2A.

FIG. 2C illustrates a cross-sectional view of the device 200 along line B-B, as drawn in FIG. 2A. Line B-B may be drawn through components 202A and 202B. In some embodiments, as shown in the figure, two or more components (e.g., chips or packages) may have different heights due to, e.g., different designs and/or manufacturing variations. For example, component 202A may be shorter than component 202B, resulting in a height difference 220. In some embodiments, the height difference 220 may be due to differences in the types of components. For example, memory chip 203A may be taller than processor chip 202A. As another example, high-power chip 202B may be taller than high-power chip 202A. It is also contemplated that in instances where components 202A and 202B have the same height, they may be located at different planes after assembly to the substrate 210 due to differences in final solder size during assembly (e.g., differences in solder ball compression during soldering).

If the height differences of the components in the device 200 are not accounted for, the test system may not be able to adequately control the testing conditions of the components of the device 100. For example, the test system may have an adapter or associated heater that contacts the top of component 202B, but not the top of component 202A, due to the height difference 220. As a result, the test system may be thermally coupled to the component 202B, but may not be adequately thermally coupled to the component 202A. Such lack of thermal coupling may cause performance problems when testing the component 202A. Example test systems of the disclosure are capable of simultaneously testing different components in one or more devices under test having different set point temperatures. The thermal control of the different components is such that they have temperatures within a tolerance (such as 1%, 5%, etc.) from respective set point temperatures without compromising the performance of the components. Additionally or alternatively, the test systems of the disclosure are able to test device(s) comprising multiple components having different heights at a given time without compromising thermal performance.

Although FIGS. 2A-2C illustrate two components with eight other components located along the sides of a substrate, embodiments of the disclosure may include any number and/or arrangement of components. Additionally or alternatively, the components in a device may be arranged in any manner not shown in the figure.

Figure 3A:
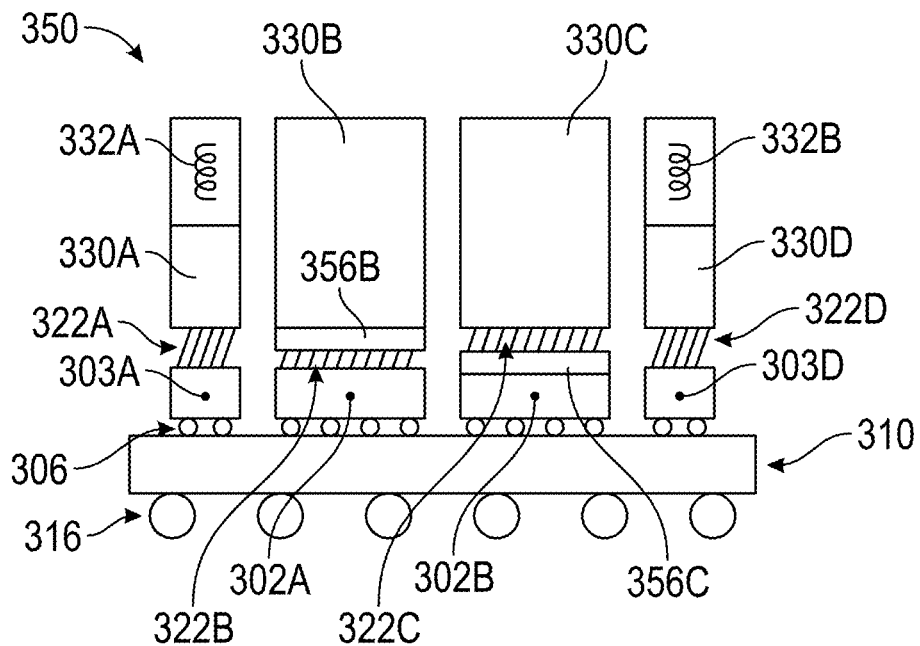
FIGS. 3A-3C illustrate cross-sectional views of an example thermal head comprising a plurality of adapters, according to some embodiments.
Figure 3B:
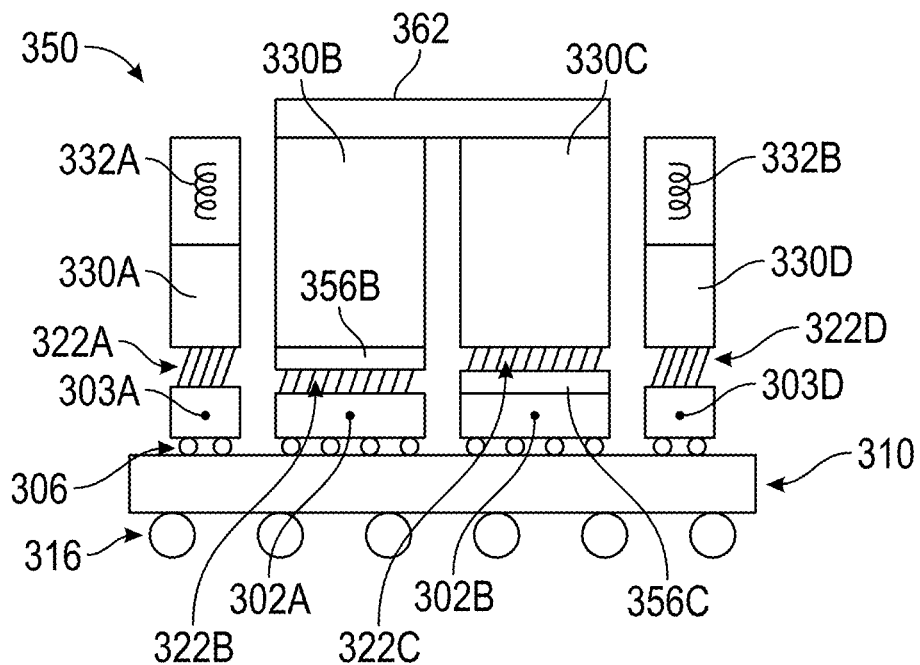

Embodiments of the disclosure may include a test system comprising a thermal head configured to thermally control one or more devices under test. FIGS. 3A-3B illustrates cross-sectional views of an example thermal head comprising a plurality of adapters, according to some embodiments. The thermal head 350 may be configured to test one or more devices. The device may comprise component 302A, component 302B, component 303A, component 303D, substrate 310, interconnects 306, and interconnects 316, which may have one or more properties similar to component 202A, 202B, 203A, 203D, substrate 210, interconnects 206, or interconnects 216, respectively.

The thermal head 350 may comprise a plurality of adapters 330A-330D. Adapters 330B and 330C may be located at the inner regions of the thermal head 350, and the adapters 330A and 330D may be located at the outer regions of the thermal head 350. Each adapter 330 may be thermally coupled to a corresponding component of the device. In some embodiments, one or more (e.g., each) adapters may be thermally coupled to one component. In some embodiments, a first adapter may be thermally coupled to a first component, and a second adapter may be thermally coupled to a second component. Adapter 330A may be thermally coupled to component 303A, adapter 330B may be thermally coupled to component 302A, adapter 330C may be thermally coupled to component 302B, and adapter 330D may be thermally coupled to component 303D. In some embodiments, the number of adapters used for testing a device may be the same as the number of components in a device. In some embodiments, at least one adapter may be thermally coupled to one or more (e.g., at least two) components. For example, an adapter may be thermally coupled to a first component and a second component. In some embodiments, the number of adapters used for testing a device may be less than the number of components in a device.

By being thermally coupled, the temperature of an adapter may affect the temperature of a corresponding thermally-coupled component. In some embodiments, two or more adapters may be thermally independent from one another such that the temperature of one adapter and/or its corresponding thermally-coupled component may not affect the temperature of another adapter and/or its corresponding thermally-coupled component. For example, the adapter 330B may be thermally independent from the adapter 330C, resulting in the temperatures of the adapters and/or corresponding thermally-coupled components not affecting each other. In some embodiments, the adapters and/or thermally-coupled components may be independently controlled, such as independently thermally controlled.

The independent control may comprise one or more of: independent thermal control (e.g., using independent adapters, independent heaters, independent flow control, independent heat sinks. and/or independent cold plates), or independent force control (e.g., using independent force mechanisms). In this manner, the test system may provide different thermal control for different components of a device.

One or more properties of one or more adapters may be such that different properties (e.g., heights) of the components may be accounted for such that the heat transfer between a thermal head and a component may not be compromised due to, e.g., the size of the component. For example, one or more properties (e.g., size, force, etc.) of the adapter 330B may be different than one or more properties of the adapter 330C to account for the height difference between the component 302A and the component 302B. In some embodiments, the size (e.g., height) of an adapter and/or associated components may be related (e.g., inversely proportional) to the size of the corresponding thermally-coupled component. As one non-limiting example, the height of adapter 330C may be taller (compared to the adapter 330B) due to component 302B being shorter (compared to the component 302A).

In some embodiments, first adapter 330B may have a first height and second adapter 330C may have a second height. This difference in height may account for height differences between corresponding components of the device(s) under test. In some embodiments, first adapter 330B may have a first thermal mass and second adapter 330C may have a second thermal mass. The difference in thermal mass may account for differences in thermal masses between corresponding heaters. In some embodiments, first adapter 330B may have a first surface area, and second adapter 330C may have a second area. This difference in surface area may account for differences in surface area between corresponding components of the device(s) under test, or differences in thermal interface material (TIM) layers. The adapters may have other differences, such as different thermal conductivities, widths, etc. In some embodiments, differences in the adapters may lead to heating or cooling the components by different amounts.

The multiple-adapter thermal head of the disclosure comprises a monolithic adapter that is thermally coupled to components of a device under test. The monolithic adapter may be made of a continuous material. In some instances, the monolithic thermal head may comprise a monolithic cold plate, a monolithic heater, and/or a plurality of large-sized heaters (greater than 900 $mm^2$, as one non-limiting example). An example adapter is described in more detail below.

As shown in the figure, the thermal head 350 may include one or more heaters 356 thermally coupled to one or more adapters and one or more components of one or more devices under test. For example, the adapter 330B may be thermally coupled to a heater 356B, and the adapter 330C may be thermally coupled to a heater 356C. The first heater 356B may be configured to heat the first component 302A, and the second heater 356C may be configured to heat the second component 302B. In some embodiments, two or more heaters 356 may be thermally independent from each other such that the thermal control of one and/or its corresponding thermally-coupled component may not affect the thermal control of another heater 356 and/or its corresponding thermally-coupled component. In some embodiments, one or more (e.g., each) adapters may be thermally coupled to a unique heater. In some embodiments, one or more adapters, such as the adapter 330A shown in FIG. 3A, may not be thermally coupled to a heater. Example heaters are discussed in more detail below.

A heater may be located close to a corresponding thermally-coupled component so that the delay between the change in temperature of the heater and the change in temperature of the device may be minimized. In some embodiments, at least one heater may be located adjacent to (e.g., contacts) at least one component, or an intermediate layer (e.g., a TIM layer) that contacts the component. In some embodiments, at least one heater may be located adjacent to (e.g., contacts) at least one adapter. The at least one heater and the at least one adapter may comprise mating alignment features for aligning the two together. Any misalignments may reduce the amount of thermal coupling between the heater and the adapter. Example mating alignment features may include, but are not limited to, protrusions on one surface and mating indents on another surface, or the perimeter shape of one element (e.g., the heater) and a corresponding recess or outline in the adapter or a retainer.

Embodiments of the disclosure may include a heater comprising a plurality of (e.g., at least two) heating elements that are spatially separated and thermally isolated using a thermal insulator between the heating elements. In some embodiments, a thermal insulator (e.g., a thermal insulating material or air) may be located between at least two heating elements to prevent or reduce thermal coupling between them. Example thermal insulating materials may include, but are not limited to, materials having low thermal conductivity (e.g., polymers, plastics), materials having a high void content (e.g., foam materials, mineral wool), air, vacuum, or the like. In some embodiments, the thermal insulating material may comprise through-holes or trenches for increased thermal isolation.

In some embodiments, a heater 356 may be a small-sized heater (less than 500 mm$^2$, as one non-limiting example). Small-sized heaters may have increased complexity and/or manufacturing yields compared to large-sized heaters. Small-sized heaters may also be easier to control due to their lower thermal mass, particularly suitable for maintaining a device at or within a certain range from a set point temperature. In addition to being easier to control, small-sized heaters may operate faster (in terms of temperature change), making thermal control of a device under test more stable and accurate. In some embodiments, the size of a heater may be based on the size of the component that it is thermally coupled to. For example, a device under test may comprise a plurality of components having different sizes, such as large-sized components and small-sized components, and the corresponding test system may comprise a plurality of heaters having different sizes, such as large-sized heaters and small-sized heaters. In some embodiments, the surface areas of the device and heater that contact each other may be the same. An intermediate layer such as a TIM layer may also have the same surface area.

Additionally or alternatively, one or more TIM layers 322 may be used to enhance thermal coupling between an adapter and a corresponding component of the thermal head or DUT. In some embodiments, a TIM layer 322 may be located on at least one side of an adapter and/or a heater. The TIM layer 322 may be located between an adapter and a device (such as TIM layer 322A located between adapter 330A and component 303A), between a heater and a device (such as TIM layer 322B located between heater 356B and component 302A), or between an adapter and a heater (such as TIM layer 332C located between adapter 330C and heater 356C). Additionally or alternatively, in some embodiments, a TIM layer may be located between an adapter and a heater, and the same or a different TIM may be located between the heater and a device (e.g., a TIM layer on both sides of the heater). In some embodiments, different TIM layers may have different properties. For example, the thermal resistance of the TIM layer 322B may be different from the thermal resistance of the TIM layer 322C. Example TIM layers are discussed in more detail below.

In some embodiments, one or more properties of the heater and/or TIM may be configured to account for different sized components such that the heat transfer between a heater (or an adapter) and a component may not be compromised due to the size of the component. Returning back to the previous example of component 302A being taller than component 302B, in some embodiments, the height of the heater 356B and/or TIM layer 322B may be less than the height of the heater 356C and/or TIM layer 322C.

Embodiments of the disclosure may further include one or more force mechanisms 332A or 332B to move a corresponding adapter closer to a thermally-coupled component. Example force mechanisms may include, but are not limited to, a spring, a lever coupled to a force applicator, or a force applicator. In some embodiments, the force mechanism 332 may apply a force onto one side of the adapter to move the other side closer to the surface of the TIM layer 322 and/or component. In some embodiments, movement of a first adapter is independent from movement of a second adapter; for example, movement of adapter 330B may not cause movement of adapter 330C, and therefore movement of heater 356B may be independent from movement of heater 356C. As one non-limiting example, the independent movement of the adapters may account for any height differences (e.g., due to manufacturing tolerances). Embodiments of the disclosure comprise test systems capable of independently controlling the forces on different components.

The disclosed thermal head may comprise one or more controllers. One example controller is a thermal controller configured to control one or more heaters. A thermal controller may send one or more signals to a given heater including, but not limited to, sending different signals to different heaters such that they are independently controlled. For example, a first signal sent to the first heater 356B may adjust its temperature without affecting the second heater 356C. In some embodiments, at least two components may be tested at different temperatures during a given test operation, and corresponding controllers and heaters may operate independently to maintain the components at those respective temperatures. For example, a first controller and corresponding heater 356B may operate to insure the first component 302A is at a first temperature, while a second controller and corresponding heater 356C may operate to insure the second component 302B is at a second temperature.

In some embodiments, at least two components and corresponding heaters 356 may have different changes in temperature. The at least two components may have different power dissipation levels, for example, and as a result, different changes in temperature. For example, the first component 302A may dissipate a first power level, and the second component 302B may dissipate a second power level. The first heater 356B may operate at a first change in temperature corresponding to the first power level, while the second heater 356C may operate at a second change in temperature corresponding to the second power level. Additionally or alternatively, the thermal controller may control the temperature(s) based on power dissipated from the component(s) of one or more devices under test.

In some embodiments, two or more adapters may be thermally dependent, such that they are thermally coupled together. Two or more adapters (e.g., adapters 330A and 330D) may be coupled to the same inputs from the thermal controller. For example, the components 303A and 303D may be low-power memory chips or packages arranged in a row of four, such as shown by the arrangement of components 203A-203D on the left side of FIG. 2A or components 203E-203H on the right side. A single adapter or a plurality of adapters may be thermally coupled to plurality of components. In some embodiments, the plurality of adapters and/or the plurality of components may have the same height.

Additionally or alternatively, the controller may comprise a force controller configured to send a plurality of signals to the thermal head to independently control one or more forces applied to one or more components. The force controller may send one or more signals to a given force mechanism, such as sending different signals to different force mechanisms to control the force applied by a given adapter. As one non-limiting example, a force controller may cause a first force to be applied to a first adapter 330B and a second force to be applied to a second adapter 330C. For example, the force controller may apply a larger force to a component having a larger surface area compared to a component having a small surface area. In some instances, the pressure on the larger surface area component may be the same as the pressure on the smaller surface area component.

In some embodiments, the thermal head 350 may comprise one or more cold plates configured to lower the temperature of one or more of: one or more adapters, one or more components, or the device. FIG. 3B illustrates an example thermal head comprising a cold plate 362. In some embodiments, at least two of the plurality of adapters may be thermally coupled to the same cold plate, such as adapter 330B and 330C being thermally coupled to cold plate 362. Thermal energy may be transferred to/from the cold plate 362 to the adapter 330B and/or adapter 330C. The cold plate 362 may be located on the top side of one or more adapters 330, and one or more heaters 356 may be located on the bottom side of the adapter(s) 330. In some embodiments, the cold plate 362 can cool components 303A and/or 303D by, e.g., contacting at least a part of the force mechanisms 332A and/or 332B.

Figure 3C:
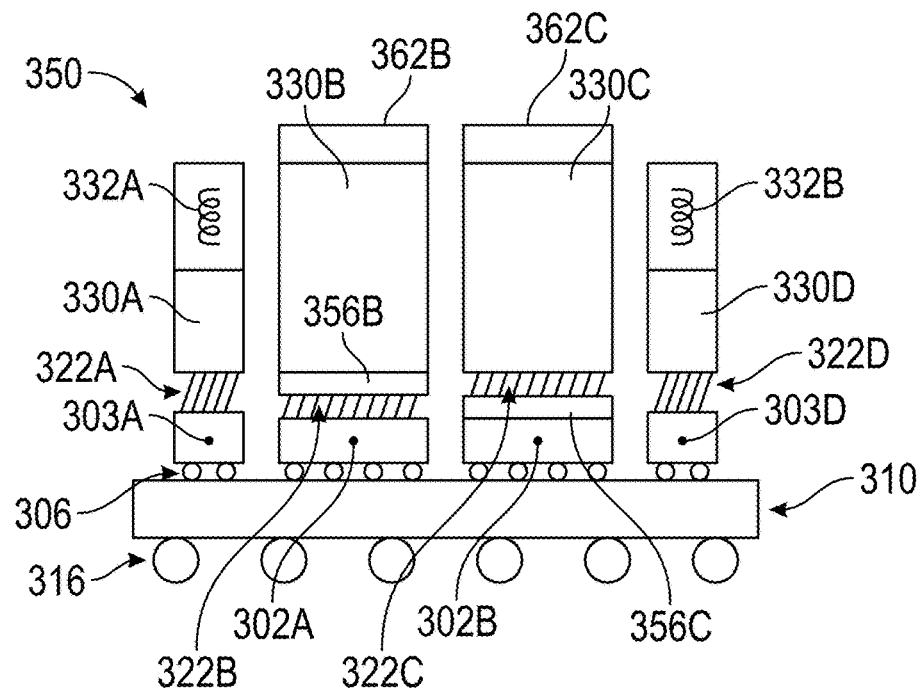

In some embodiments, the thermal head 350 may comprise a plurality of cold plates, such as shown in FIG. 3C. At least two cold plates may be thermally independent from one another. Cold plate 362B may be thermally coupled to the adapter 330B, and the cold plate 362C may be thermally coupled to the adapter 330C. The thermal control of the cold plate 362B may not affect the temperature and/or thermal control of the cold plate 362C and vice versa, for example.

In some embodiments, movement of cold plate 362B may be independent from movement of cold plate 362C. The amount of force applied may depend on the properties of the corresponding component, heater, TIM, adapter, or a combination thereof. More force may be applied when a corresponding component has a larger surface area, for example. Example force mechanisms are discussed in more detail below.

In some embodiments, at least two components and corresponding cold plates 362 may have different changes in temperature due to, e.g., having different power dissipation levels. For example, the first component 302A may dissipate a first power level, and the second component 302B may dissipate a second power level. The first cold plate 362B may operate with a first temperature corresponding to the first power level, while the second cold plate 362C may operate with a second temperature corresponding to the second power level. Additionally or alternatively, the cold plates 362B and 362C may operate at different temperatures, such as when the corresponding components are tested at different temperatures.

The thermal controller may be configured to control one or more heaters (as discussed above), one or more cold plates, or both. To control the cold plate(s), the thermal controller may send one or more signals to one or more flow control valves associated with each cold plate. In instances where the thermal head comprises at least two cold plates, the thermal controller may send one signal to one cold plate's flow valve without affecting the flow through another cold plate's valve (independent flow control). The cold plate and associated thermally-coupled components (adapter, heater, component, etc.) may be thermally isolated from other (e.g., neighboring) cold plates and associated thermally-coupled components. In some embodiments, a thermal insulator (e.g., a thermal insulating material or air) may be disposed between neighboring cold plates.

The properties of a cold plate 362 may be based on the properties of a thermally-coupled adapter 330. For example, the surface area of the cold plate 362 (that contacts the adapter) may be the same as the surface area of the adapter 330 (the top side of the adapter that contacts the cold plate). As discussed in more detail below, a cold plate 362 may comprise one or more cooling channels that a liquid or gas may flow through. The flow rate and/or temperature of the liquid or gas may affect the cooling abilities of the cold plate 362.

Example Thermal Head

Figure 4:
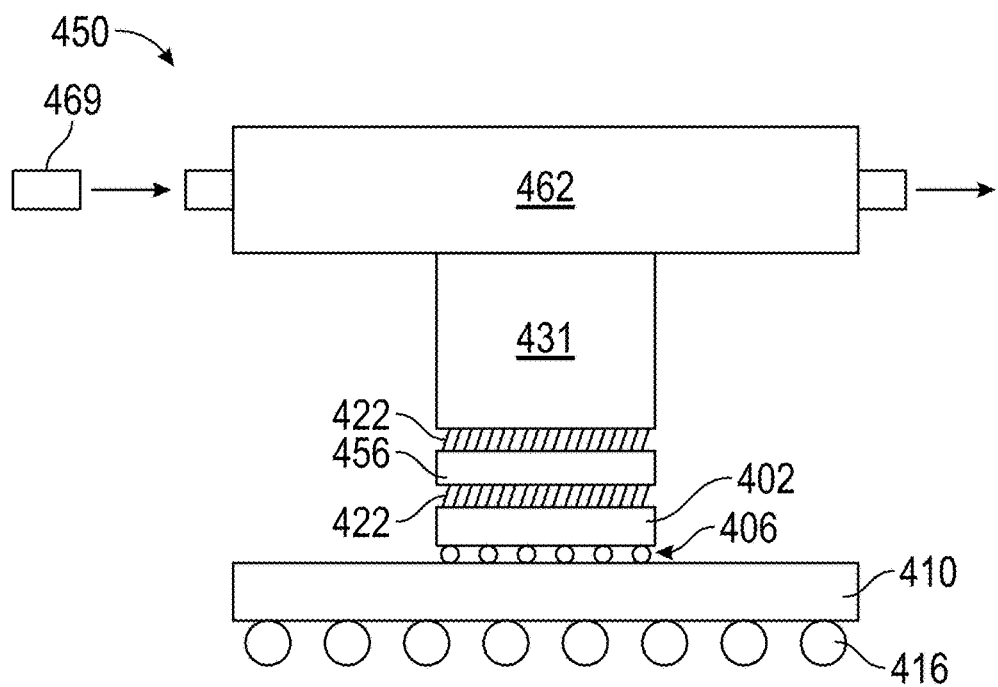
FIG. 4 illustrates a cross-sectional view of a portion of a thermal head, according to some embodiments.

Embodiments of the disclosure may include one or more thermal heads with the properties as described herein. For purposes of simplifying the descriptions, some of the figures may illustrate some, but not all, portions of the disclosed thermal heads. A portion of a thermal head, comprising an adapter, will now be described, but the thermal head may include other portions not disclosed or in combination with the disclosures herein. FIG. 4 illustrates a cross-sectional view of a portion of a thermal head, according to some embodiments. The thermal head 450 is configured to thermally control a component 402 mounted on a substrate 410. Although the figure illustrates a single adapter 430 and single component 402 on a single substrate 410, embodiments of the disclosure may include any number of components (e.g., 2, 3, 4, 5, 10, etc.), any type of components (e.g., high-power chips, low-power chips, passive components, etc.), and any number of substrates.

When testing a device, it may be difficult, but important, to control the temperature of the device while being tested. In some instances, thermal control may require heating or cooling one or more components of the device at a rapid rate so that the component(s) may reach the set point temperature quickly and the temperature remains constant during the test.

The adapter 430 may comprise a continuous piece of thermally-conductive material. For example, the adapter 430 may comprise a metal such as copper, aluminum, silver, or a metal matrix composite (copper-diamond, aluminum-diamond, copper-graphite, aluminum-graphite, etc.). One or more properties (e.g., thermal mass, height, surface area, etc.) may be based on the set point temperature and/or the properties of the thermally-coupled heater and/or cold plate.

In some embodiments, the thermal head 450 may comprise a heater 456. The heater 456 may be configured to apply heat to the component 402. In some embodiments, the heater 456 may increase the temperature of the component 402 when, e.g., the component power is low and/or when its temperature is lower than the set point temperature of the component 402. The heater 456 may be any type of heater including, but not limited to, a solid-state device (e.g., comprising a ceramic body with one or more resistive traces), a cartridge heater in a thermally-conductive body, a thermoelectric device (TED), a silicon-based semiconductor device, etc. In some embodiments, the heater 456 may have a low thermal mass. In some embodiments, the thermal mass of the heater 456 may be less than the thermal mass of the adapter 430, the cold plate 462, or both. In some embodiments, the thermal mass of the heater 456 may be at least 5 times lower than the thermal mass of the adapter 430. In some embodiments, the thermal mass of the heater 456 may be at least 10 times lower than the thermal mass of the adapter 430. The thermal mass of the heater 456 may affect its responsivity, temperature ramp rate, and conductive heat transfer, e.g., through the heater 456, adapter 430, cold plate 462, or a combination thereof.

Additionally or alternatively, the thermal head 450 may comprise cold plate 462. The cold plate 462 may be configured to cool the adapter 430, which may thereby cool the heater 456 and/or component 402. When the heater 456 is off, the cooled adapter 430 may cool the heater 456. The cold plate 462 may include one or more cooling channels 469, which may circulate liquid or gas to cool the cold plate 462. Example liquids may include, but are not limited to, water, a heat transfer fluid, a refrigerant coolant, a gas, etc. In some embodiments, one or more other cooling mechanisms may be used to cool the cold plate 462, such as a thermo-electric cooler (TEC) (as one non-limiting example). The TEC may cool the cold plate 462 below the temperature of a fluid circulating through the cold plate 462, for example. As another (non-limiting) example, a chiller or a radiator may be used to cool the temperature of the fluid.

The adapter 430 may be configured to thermally couple to the component 402. Better thermal coupling may lead to better thermal control. In some embodiments, thermal coupling may occur by way of the adapter 430 making contact with the component 402 and/or using one or more intermediate layers to facilitate heat transfer between the adapter 430 and the component 402. TIM layers 422 are example intermediate layers.

In some embodiments, one or more TIM layers 422 may be located between one or more components of the thermal head 450. A TIM layer 422 may be used to reduce thermal resistance, thereby enhancing the thermal coupling. For example, one TIM layer 422 may be located between the adapter 430 and the heater 456, and/or one TIM layer 422 may be located between the heater 456 and the component 402. As another example, a TIM layer 422 may be located between the cold plate 462 and the adapter 430 (not shown). In some instances, a TIM layer may be excluded, and instead, the cold plate 462 and adapter 430 may be one continuous material (e.g., a cold plate with one or more adapters machined out of its surface). A TIM layer may comprise one or more of: a thermal grease (e.g., oil or other material comprising embedded thermally-conductive particles such as metal particles or ceramic particles), a liquid material (e.g., glycol, water), a carbon material, a metallic malleable material (e.g., a low-melting point material such as indium, tin, or a combination of materials such as a thermally conductive elastomeric pad with an aluminum foil cover layer), a thermally conductive elastomeric pad, or the like.

In some embodiments, thermal coupling between the adapter 430 and the component 402 may be improved when there is a force applied to components of the thermal head 450 and/or the component 402, making better contact. The thermal resistance between the adapter 430 and the component 402 may be related to the amount of applied force. The applied force may also impact the contact between socket contactors and interconnects 416 (which the test system uses to electrically connect to the component). Additionally or alternatively, the applied force may help prevent or reduce the component 402 and/or substrate 410 from unwanted warping, which may lead to defects.

Embodiments of the disclosure may include other types of intermediate layers including, but not limited to, bumps, posts, or other contacts over the surface of the adapter, cold plate, and/or heater to increase or decrease thermal coupling. The number, size, density, and/or pattern of the bumps, posts, or contacts may be configured such that a target thermal resistance between an adapter and a heater, an adapter and a cold plate, or a heater and a component may be obtained. In some embodiments, the thermal resistance may be configured according to the type of component or device. For example, the test system for a low-power component may be configured with high thermal resistance. A low-power heater may be used for thermal control, and due to the high thermal resistance, may be able to easily heat up the low-power component.

The thermal head 450 may further comprise one or more temperature sensors to measure the temperature of the adapter 430, heater 456, or cold plate 462. The measured temperature may be used by the thermal controller to set, adjust, or maintain the temperature of the adapter 430, heater 456, and/or cold plate 462. The measured temperature may be compared to a set point temperature, and the signals sent to the controller may be updated accordingly to minimize the difference between the measured temperature and the set point temperature. Setting, adjusting, or maintaining the temperature of the heater 456 may comprise setting, adjusting, or maintaining the current or voltage from the thermal controller to the heater 456. Setting, adjusting, or maintaining the temperature of the cold plate 462 may comprise setting, adjusting, or maintaining the flow rate or temperature of the liquid or gas associated with the cold plate 462. In some embodiments, the update frequency of the thermal controller for controlling the temperatures is less than 200 microseconds.

An example method for controlling the temperature of a component includes, but is not limited to, setting or adjusting the temperature based on whether the measured temperature (e.g., heater temperature) is above or below the set point temperature (or set point temperature range). If the measured temperature is above the set point temperature, the thermal controller reduces the amount of power to the heater. If the measured temperature is below the set point temperature, then the thermal controller increases the amount of power to the heater. In some embodiments, the heater may be configured for a specific power output of the thermal controller. As one example, the thermal controller is capable of powering the heater with up to 500 W using 100 V, where the heater generates 500 W with a 100 V supply (e.g., for the set point temperature or across the set point temperature range). In some embodiments, the heater may be configured for the corresponding component, such as the heater having an output power that is greater than the output power of the component. For example, a 30 W heater may be used to heat a 10 W component, while a 300 W heater may be used to heat a 100 W component. The lower the thermal mass of the heater, the more effective the heater 456 becomes in increasing the temperature of the component 402 quickly. In some embodiments, the thermal controller separately sets or adjusts different temperatures of the thermal head. For example, the controller sets or adjusts a DUT temperature, an adapter temperature, a cold plate temperature, etc.

Example Heater

Figure 5A:
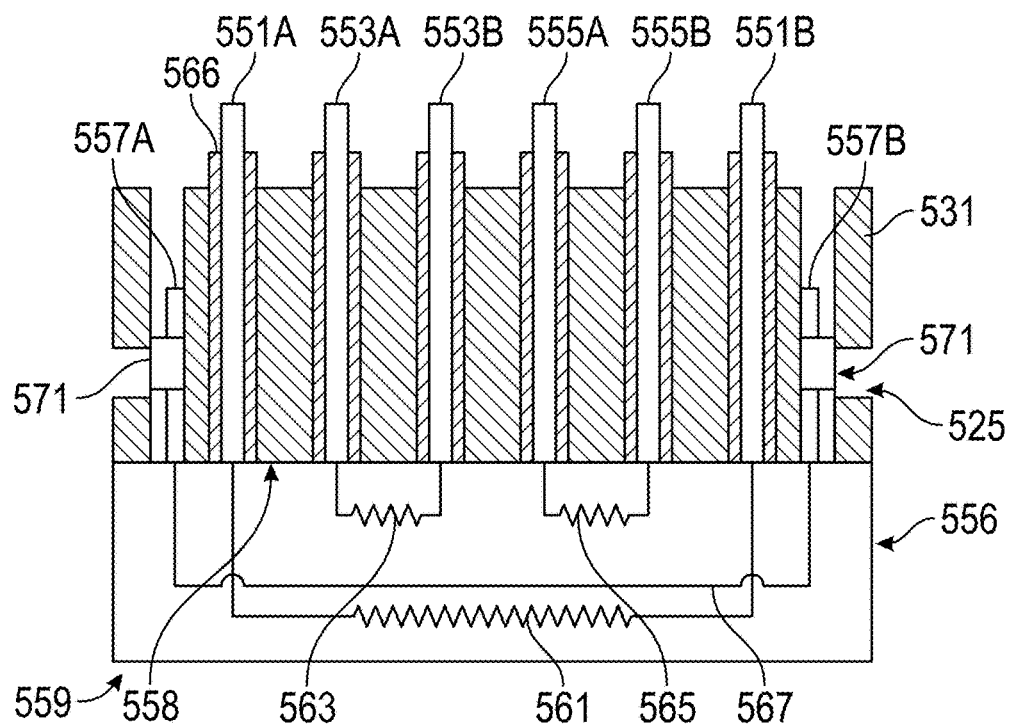
FIG. 5A illustrate a cross-section diagram of an example heater, according to some embodiments.

FIG. 5A illustrate a cross-section diagram of an example heater, according to some embodiments of the disclosure. The figure illustrates one surface 558 of the heater 556, which contacts an adapter 530 or one or more TIM layers (which would be located between the surface of the heater 556 and the adapter 530). Another surface 559 of the heater 556 may contact a component of the DUT or a TIM layer (which would be located between the surface 559 of the heater 556 and a component of the DUT).

In some embodiments, the heater 556 may comprise a plurality of heater pins, one or more heating elements, one or more measurement traces, or a combination thereof. Some of the plurality of pins 551 (including pins 551A and 551B), 553 (including pins 553A and 553B), 555 (including pins 555A and 555B), and 557 (including pins 557A and 557B) may be pins used to carry electrical current into and out of the heater 556. In some embodiments, the pins 551, 553, 555, and/or 557 may be attached to one or more pads (not shown) on the heater 556. Example methods for attaching the heater pins to the pads include, but are not limited to, brazing, soldering, gluing (e.g., using electrically-conductive epoxy), etc. As shown in the figure, one or more insulating layers 566 may insulate the pins 551, 553, 555, and 557 from the adapter 530, e.g., to prevent electrical shorts. The insulating layers 566 may be located around the heater pins, and/or between the heater pins and the adapter 530. The insulating layers 566 may comprise one or more of: plastic, rubber, ceramic, or another dielectric. In some embodiments, an insulating layer 566 may be a hollow polytetrafluoroethylene (PTFE) tube with an inner diameter sized for the diameter of a heater pin and an outer diameter configured to fit into clearance holes in the body of the adapter 530.

Although FIG. 5A illustrates a single row of six heater pins, embodiments of the disclosure may comprise any configuration and number of heater pins, such as a single row of heater pins arranged around the perimeter of the surface of the heater, two heater pins in a row on one side of the heater, 10 or more heater pins in a row, 4 pins in two rows on two sides of the heater, or the like. In some embodiments, the plurality of heater pins may occupy less than 10%, 30%, 50%, etc. of the surface 558 of the heater 556. In some embodiments, the inner region of the surface 558 of the heater 556 may exclude heater pins to allow the heater 556 to make contact with the adapter 530 at the inner region.

The heating elements 563 and 565 may be used to generate heat for the heater 556. In some embodiments, the heating elements 563 and 565 may comprise resistors and/or resistive traces. The total area of thermal control by the heater 556 may depend on the properties of the heating elements 563 and 565. For example, the heating elements 563 and 565 may be formed on separate layers within the body of the heater 556, where one or more resistive traces of the heating element may be formed on a plurality of layers so that a target resistance within a target area of the heater 556 may be obtained. In some embodiments, the heating elements 563 and 565 may be located closer to the adapter 530 than the ground plane 567 and measurement trace 561.

In some embodiments, each zone of the thermal head may comprise one or more heating elements and a measurement trace 561. In some embodiments, any number of heating elements and measurement traces may be associated with a zone, depending on the power requirements of the zone and power limitations of the heating elements. In some embodiments, the total area of thermal control may be the same as the total surface area of the heater 556. Alternatively, the total area of thermal control may be less (e.g., 20%) than the total surface area of the heater 556. A heating element may be located throughout a large percentage (e.g., 80% or more) of the surface of the heater 556, or certain zone(s) of the heater 556. In some embodiments, one or more first heating elements may be associated with one or more first zones, and one or more second heating elements may be associated with one or more second zones. As one non-limiting example, the first heating elements and first zones may be high-power heating elements and high-power zones, respectively, while the second heating elements and second zones may be low-power heating elements and low-power zones, respectively.

The heating elements 563 and 565 may be configured to generate heat using, e.g., resistors. The heating elements may be electrically coupled to heater pins such that power via a current or voltage signal can be applied to the heater pins to turn on the corresponding heating elements. Power applied to pins 553A and 553B may cause the electrically-coupled heating element 563 to turn on and generate heat, and power applied to pins 555A and 555B may cause the electrically-coupled heating element 565 to turn on and generate heat. In some embodiments, the number of heating elements and/or heating element layers may be increased to increase the overall power output from the heater 556 at a given voltage. For example, a heater 556 may comprise five heating elements, each configured to generate 200 W at 200 VDC, thereby generating a total output power of 1000 W.

In some embodiments, the heater 556 may comprise a plurality of heating zones. In some embodiments, the heater 556 may comprise one or more insulating mechanisms to insulate two or more heaters or heating zones from each other. One example insulating mechanism comprises through-holes or trenches in the body of the heater at location(s) between the heating elements and edge(s) of the heating zones. Another example insulating mechanism comprises using different adapters for different zones, such as one or more first adapters and associated heaters for a first heating zone, and one or more second adapters and associated heaters for a second heating zone.

The measurement trace(s) 561 may be used for measuring the temperature of one or more surfaces (e.g., the surface 559 that contacts a component or an intermediate TIM layer) of the heater 556. The measurement trace 561 may be located within the body of the heater 556. The measurement trace 561 may be located close to the surface 559, for example. In some embodiments, the measurement trace 561 may be a trace with a certain temperature coefficient of resistance such that its resistance can be correlated to a temperature reading, this type of device is also referred to as a resistance temperature detector (RTD).

In some embodiments, after manufacturing the heater 556, resistances of the measurement trace 561 can be measured at different temperatures to generate pre-determined calibration information such as a calibration curve, calibration table, or associated relationships (between resistance and temperature). The pre-determined calibration information may be stored in, e.g., a non-volatile memory chip or coded into a 1D or 2D code (e.g., a linear barcode or 2D matrix barcode) or stored remotely in a database. The pre-determined calibration information may be used by a controller to determine the temperature of a heater or heat zone and use that knowledge to control one or more resistors (e.g., resistor 563 or resistor 565) included in the heater for thermal control of a corresponding zone.

In some embodiments, a measurement trace 561 may be coated with a dielectric. The thickness of the dielectric may depend on the physical construction and limitations of the heater 556. In some embodiments, the dielectric may have a thickness less than 2 mm. In some embodiments, the dielectric may have a thickness less than 0.4 mm. The measurement trace 561 may be located throughout the surface 559 of the heater 556 that contacts a component or intermediate layer (e.g., a TIM layer that contacts the component). For example, the area in which the measurement trace 561 is located may be the same as the area in which another heating element (e.g., resistor 563 or resistor 565) is located, although these may be on different layers in the heater.

Figure 5B:
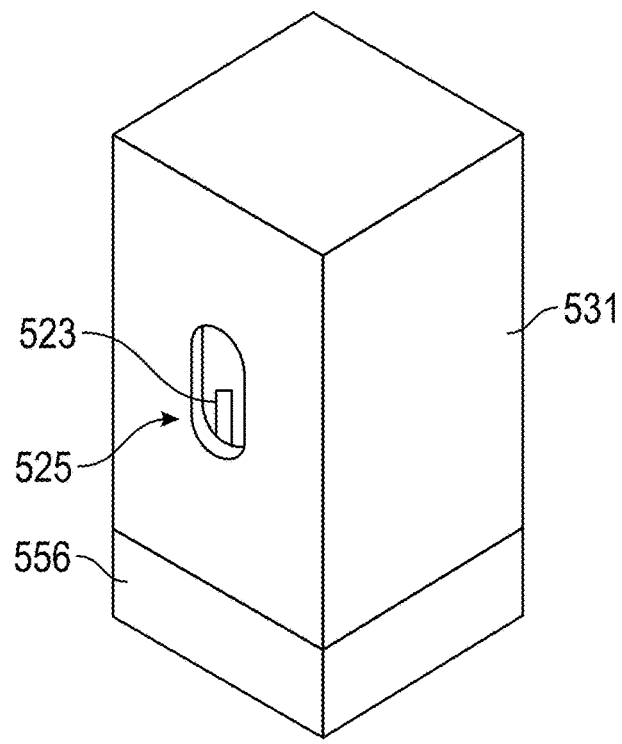
FIG. 5B illustrates an example adapter comprising a hole that provides access to a pin, according to some embodiments.

While some of the plurality of pins may be used to carry electrical current for heating, others may be used for shielding. Pins 557A and 557B, shown in FIG. 5A, may be electrically coupled to a ground plane 567 for electromagnetic interference (EMI) shielding. The ground plane 567 may be grounded, providing an electrical ground path to the heater 556 during testing. During testing, the heaters may be turned on and off in rapid succession, at high voltages and currents, which can generate electrical noise that can potentially interfere with the testing circuitry or measurements. Shielding the heater elements with a ground plane 567 that covers them may reduce or eliminate the unwanted electrical noise. In some embodiments, the pins 557A and 557B may be electrically coupled to an adapter. For example, as shown in the adapter illustrated in FIG. 5B, the adapter 530 comprises a hole 525 that provides access to the pin 557A and/or pin 557B. The hole 525 may expose ground pin 523 that may be attached to an adapter 530 by being, e.g., soldered, spot welded, brazed, glued (e.g., using an electrically-conductive adhesive), etc. In some embodiments, the pin 557A and/or pin 557B may be attached to the adapter 530 by, e.g., soldering. Having both the adapter 530 and ground plane 567 grounded improves the shielding of the heater elements compared to having only the ground plane 567 grounded. In the case where both the adapter 530 and ground plane 567 are grounded, there is an effective shield formed both above and below the heater elements.

In some embodiments, the adapter may include a retainer 571. The retainer 571 may be configured as a mechanical attachment for attaching (e.g., requiring a tool for removal) the heater 556 to the adapter 530. This mechanical attachment facilitates thermal coupling between the heater 556 and the adapter 530. Example mechanism attachments include, but are not limited to, clamps, screws, retains, or the like. As shown in the figure, the retainer 571 may be located within the body of the adapter 530, allowing the heater 556 and adapter 530 to have any sizes for surface areas, including the same-sized surface area (as one non-limiting example). With the size of the adapter being the same or substantially the same as the size of the corresponding component, the disclosed test systems are able to quickly change the temperature of the component due to, e.g., the thermal mass of the adapter. In some embodiments, the hole 525 in the adapter 530 provides access to one or more pins, such as pins 557A and 557B.

Additionally or alternatively, the retainer 571 may be configured for electrically coupling the adapter 530 to one or more ground pins 523. The ground pin 523 may be flexible ground pins, for example, that allow the heater 556 and adapter 530 to expand at different rates. The heater 556 and adapter 530 may have different coefficients of thermal expansion, allowing the two to expand and contract at different rates with temperature changes without undue stress or strain on either component and while maintaining good thermal contact between the adapter 530 and the heater 556.

In some embodiments, the heater is attached (e.g., requires a tool for removal) to the adapter. An attached heater results in better thermal coupling between the adapter, heater, and/or any intermediate layers. Without attaching the heater, any movement in the adapter and/or intermediate layers may limit how quickly heat can transfer from the heater to the adapter and/or corresponding component.

Referring back to FIG. 5A, the ground plane 567 may be a solid ground plane or a perforated ground plane (the size of the perforations may be configured based on desired EMI frequencies). In some embodiments, the area of the ground plane 567 may be greater than or equal to the area of the heating elements. In some embodiments, the area of the ground plane may be at least 80%, 85%, 90%, 95%, etc. of the area of the surface of heater 556. The ground plane 567 may be located within a certain depth from the surface of the heater 556 (that contacts a component or an intermediate layer), such as (but not limited to) less than 1.5 mm, less than 1 mm, less than 0.6 mm, etc.

Although not shown in the figure, the heater 556 may comprise a plurality of dielectric layers, a plurality of conductive layers, and/or a plurality of conductive vias for making electrical connections between the plurality of conductive layers. In some embodiments, the outer surfaces of the heater may comprise a protection layer (e.g., a dielectric such as ceramic) to protect the conductive layers located within the heater 556.

Example Cold Plate

Figure 6B:
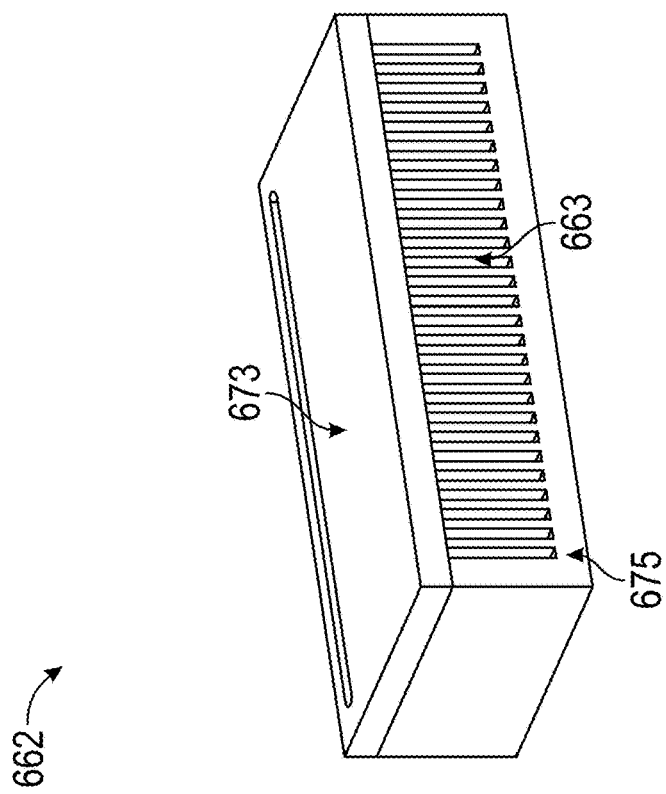
FIGS. 6A and 6B illustrate cross-section diagrams of an example cold plate, according to some embodiments.
Figure 6A:
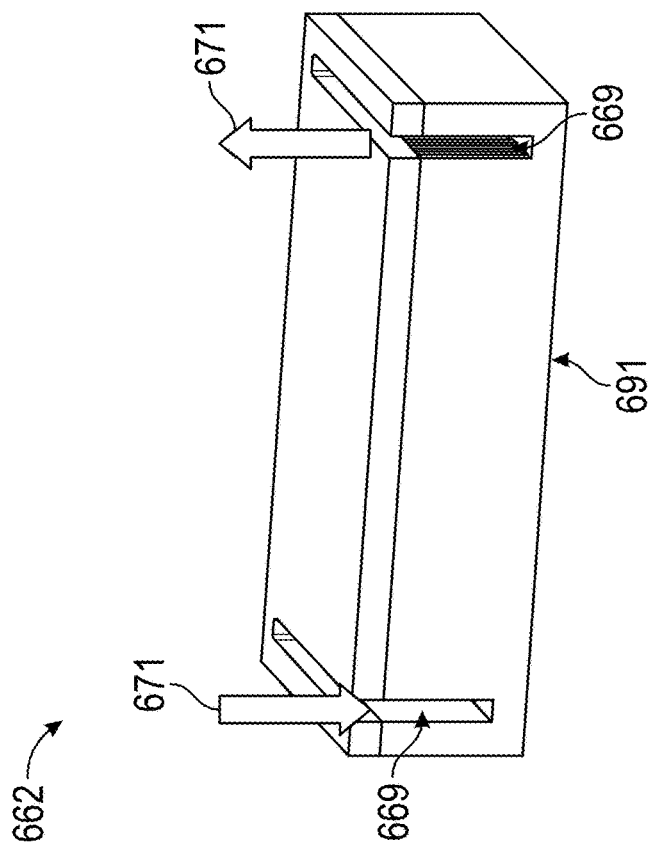

FIGS. 6A and 6B illustrate cross-section diagrams of an example cold plate, according to some embodiments of the disclosure. The cold plate 662 may be oriented such that its bottom surface 691 is located closest to a corresponding heater or adapter. The cold plate 662 comprises a cavity with an inlet and outlet for coolant 671 to circulate through the cooling channels 669. The cavity may be formed by a top plate 673 and a bottom plate 675. The cold plate 662 comprises a plurality of fins 663. In some embodiments, the plurality of fins 663 may comprise fins that are long, rectangular fins or rounded pin fins. The plurality of fins 663 may be integrated into the bottom plate 675 and top plate 673. In some embodiments, the plurality of fins 663 may be oriented perpendicular from the top plate 673 and/or bottom plate 675. The plurality of fins 663 are used to increase the surface area that contacts the coolant 671 that flows through the cold plate 662, thereby providing more effective heat transfer from the cold plate 662 to the coolant 671.

Example Thermal Interface Material (TIM) Layers

Figure 7A:
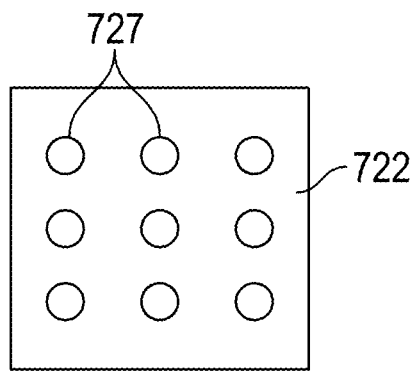
FIG. 7A illustrates an example thermal interface material comprising openings or holes, according to some embodiments.

The test system disclosed herein may use one or more TIM layers. A TIM layer may affect the thermal resistance between an adapter and a heater, an adapter and a cold plate, an adapter and a component, or a heater and a component. A TIM layer may be selected based on one or more properties of the thermal head, adapter, heater, cold plate, a component on the device under test, etc. The thermal resistance may be adjusted by configuring the thickness of the TIM layer and/or its thermal conductivity, for example. Additionally or alternatively, the surface area of a TIM layer may be adjusted by including one or more openings or holes 727, as shown in FIG. 7A. The thermal resistance of the TIM layer 722 may be configured based on size and/or number of openings or holes 727. In some embodiments, the TIM layers 722 in a thermal head may be different, e.g., a first TIM layer may have a greater surface area than a second TIM layer.

In some embodiments, the TIM layer 722 may be configured based on the properties of the associated component and/or zone. For example, a high thermal resistance TIM layer may be used for a low-power component. In some embodiments, the properties of the TIM layers may be different for different components and/or zones of a device.

Figure 7B:
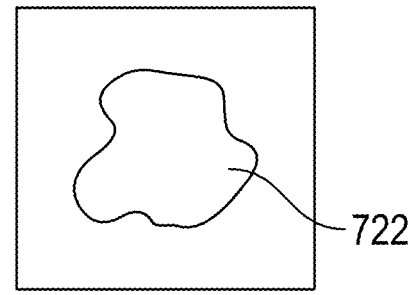
FIG. 7B illustrates an example liquid thermal interface material that is dispensed, according to some embodiments.

The TIM layer 722 may be formed using any technique, such as dispensing a liquid TIM 722 on a component or device, as shown in the example of FIG. 7B. Using a liquid TIM may help minimize gaps between an adapter and a component, for example, which may reduce the thermal resistance between the two; although other types of TIM materials may be included, such as a solid TIM material, a paste TIM material, or a grease TIM material. A reduced thermal resistance may be beneficial in instances, such as when an adapter does not comprise a heater, when an adapter is used only for cooling, when an adapter is used for adjusting the temperature of a high-power component, or when an adapter comprises a heater and is used for both heating and cooling, among others.

A liquid TIM may be dispensed on the component(s) or device prior to testing and then removed after testing has been completed. To determine whether the dispensed liquid TIM meets target properties (e.g., amount, location, thickness, etc. of the dispensed TIM), one or more techniques may be employed to inspect the dispensed liquid TIM, such as a machine vision system that visually inspects and compares it to one or more pre-determined criteria, or a system that tests its thermal resistance value. Based on whether or not the dispensed TIMs meet one or more target properties, the test system may proceed with performing the test (dispensed TIM qualifies), or create an alert (dispensed TIM does not qualify). In this manner, a device may be tested only when the TIM properties do not affect the testing of the device, ensuring that the testing results accurately represent the performance of the device. Too much dispensed liquid TIM may overflow onto one or more components and may adversely affect it during testing (e.g., if the liquid TIM is electrically conductive), or could pose a reliability issue for the device (e.g., if the liquid TIM induces corrosion or other deleterious effects). Too little TIM may lead to high thermal resistance(s), causing problems with the testing such as being able to maintain the component at a set point temperature. In some instances, if no TIM was dispensed and a high power is applied to the component, the component may fail due to thermally-induced catastrophic failure.

Example Thermal Head for a Device Comprising Stacked Components

Figure 8A:
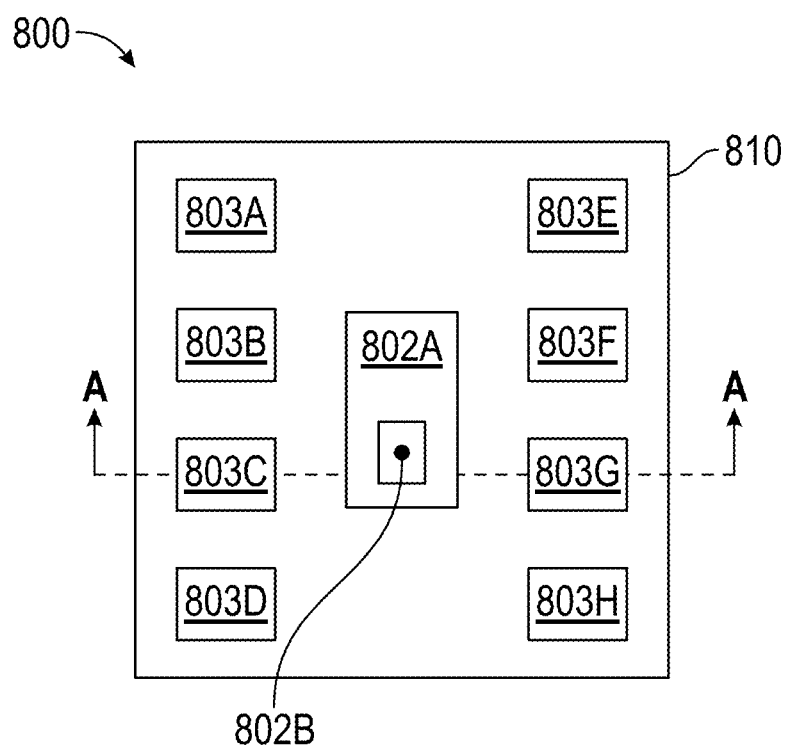
FIGS. 8A and 8B illustrate top and cross-sectional views, respectively, of a device including stacked components, according to some embodiments.
Figure 8B:
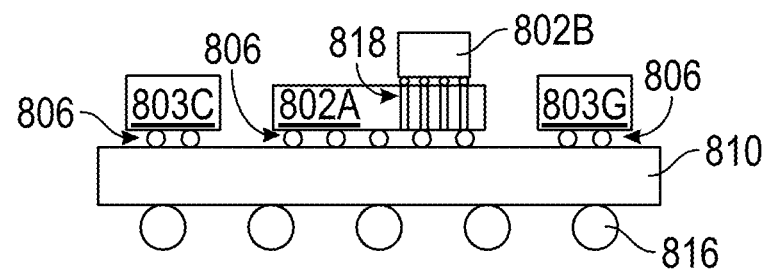

Embodiments of the disclosure may comprise other types of devices, such as a device that may comprise one or more stacked components. FIGS. 8A and 8B illustrate top and cross-sectional views, respectively, of a device including stacked components, according to some embodiments. The device 800 may include a plurality of components, such as component 802B, component 802T, and components 803A-H mounted on a substrate 810. One or more components may be stacked on one or more other components, such as component 802T being a top component stacked on a bottom component 802B. In some embodiments, the footprint of component 802T may be smaller than the footprint of component 802B. Component 802B may be a high-power component, for example. In some embodiments, the stacked components 802B and 802T may be coupled together using, e.g., one or more interconnects 818 such as one or more of: TSVs, microbumps, or the like. In some embodiments, components 803A-H may be auxiliary components.

As one non-limiting example, the component 802T may be a cache memory chip, and the component 802B may be a processor chip, where the component 802T may be stacked on the component 802B. In such an arrangement, the component 802T may be a standalone chip (e.g., a chip capable of operating independently) that provides a higher memory capacity than an internal cache in the processor chip itself. Stacking a cache chip 802T on top of the processor chip 802B may reduce interconnect length, thereby increasing read/write speeds and reducing latency. In some embodiments, the component 802B may be a high-power component, and the component 802T may be a low-power component.

Device 800 may further include substrate 810, interconnects 806, and interconnects 816, where one or more of: the substrate 810, interconnects 806, or interconnects 816 have properties similar to corresponding substrate 210, interconnects 206, or interconnects 216, respectively. As shown in FIG. 8B, there may be one or more height differences among the stacked components (comprising components 802T and 802B) and other components 803C and 803G in device 800.

Figure 9A:
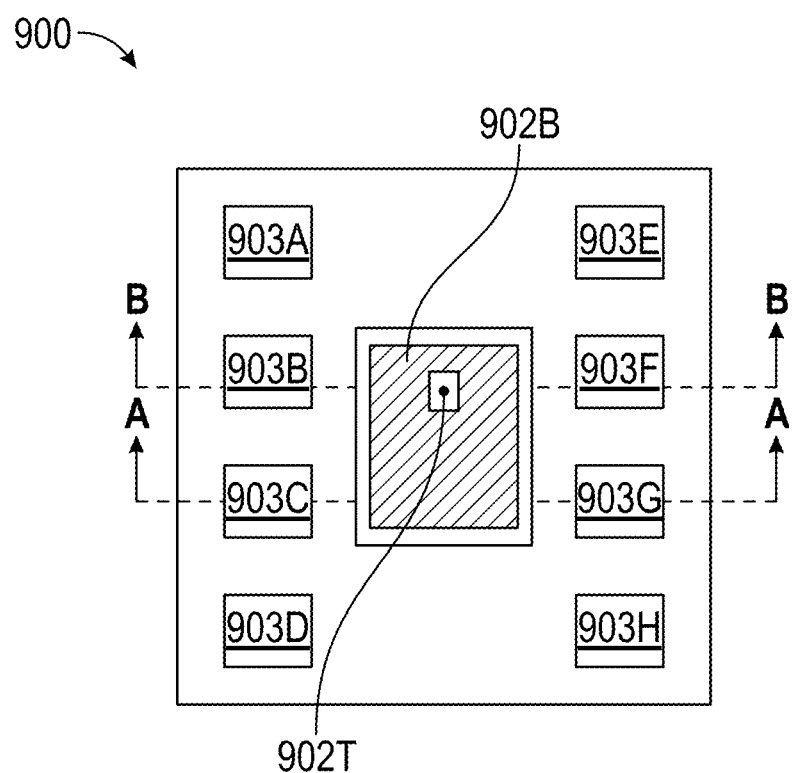
FIG. 9A illustrates a top view of an example device comprising stacked components, according to some embodiments.

The adapters of the thermal head may be configured such that heat transfer between an adapter (and/or heater and/or cold plate) and stacked components may not be compromised. FIG. 9A illustrates a top view of an example device comprising stacked components, according to some embodiments. The device may comprise components 903A-903H. Additionally, the device 900 may comprise at least one stacked component, which includes component 902T stacked on component 902B. Device 900 may have one or more properties (e.g., comprising interconnects to electrically couple components to a substrate, interconnects to electrically couple a substrate to a test system, etc.) similar to device 100, 200, 800, or a combination thereof.

Figure 9B:
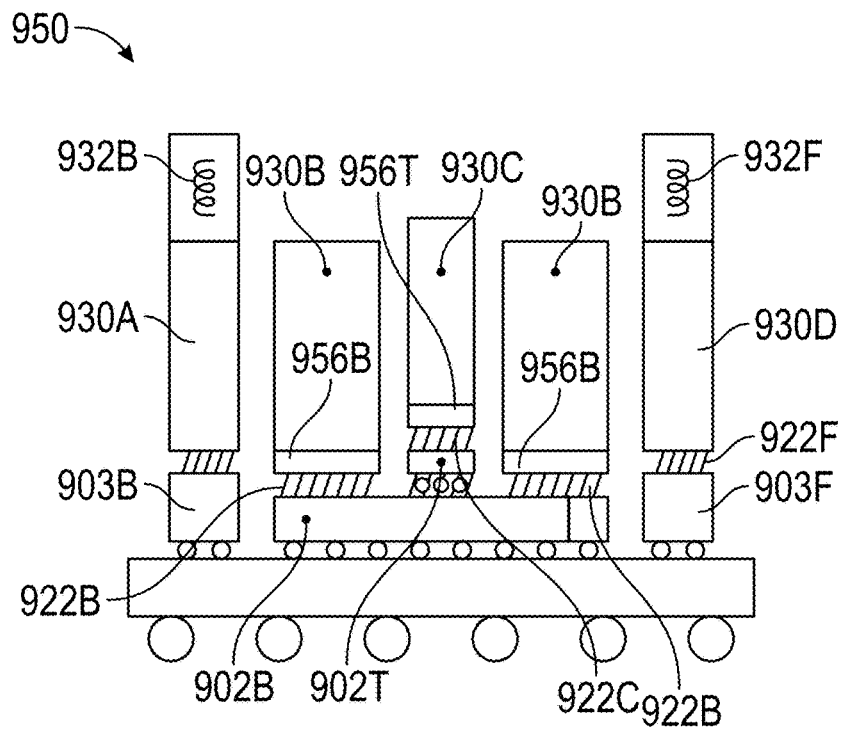
FIGS. 9B and 9C illustrate cross-sectional views of a thermal head and device, along line B-B and A-A, respectively, as drawn in FIG. 9A.
Figure 9C:
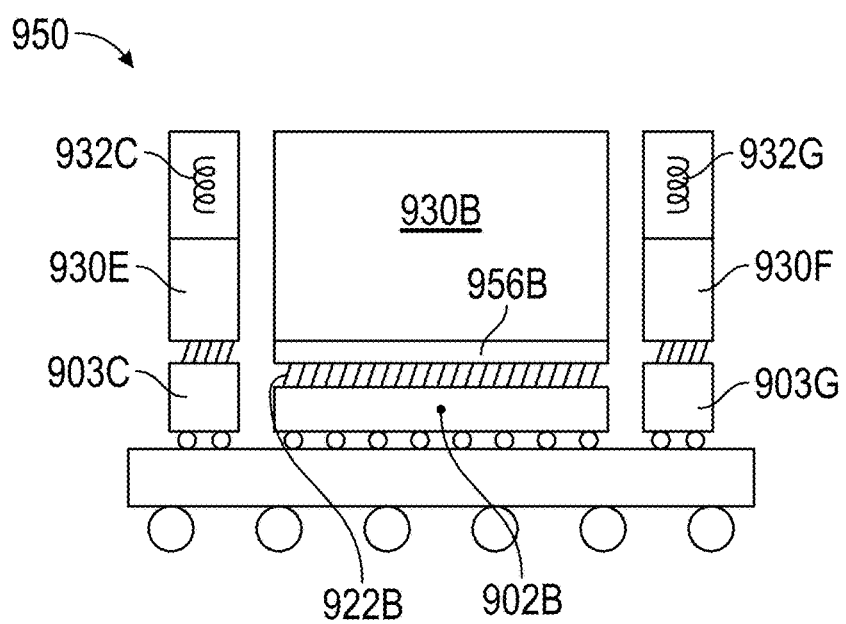

FIGS. 9B and 9C illustrate cross-sectional views of a thermal head 950 and device, along line B-B and A-A, respectively, as drawn in FIG. 9A. Thermal head 950 may comprise a first adapter 930B and/or a first heater 956B that are thermally coupled to a first component (e.g., one component 902B and/or lower portion of the stacked components) and a second adapter 930C and/or second heater 956T thermally coupled to a second component (e.g., component 902T and/or upper portion of the stacked components).

The test system may comprise a thermal head 950. The thermal head 950 may comprise plurality of adapters including, but not limited to, adapters 930A-930D. One or more adapters, such as adapters 930A-930D may have one or more properties similar to other adapters disclosed herein, such as adapters 330A-330D. For example, the adapter 930A may not be thermally-coupled to a heater. As another example, the adapter 930D may transfer force to a component applied by way of a spring or other force mechanism 932F. The adapter 930D may additionally or alternatively be contacting a TIM layer 922F, located between the adapter 930D and the component 903F.

In some embodiments, one or more adapters may be thermally coupled to a first portion of the stacked components. For example, adapter 930B may be thermally coupled to a component 902B or a portion of a component 902B of the stacked components. The thermal coupling may comprise one or more corresponding thermally-coupled components as making contact. For example, the adapter 930B may be thermally coupled to a heater 956B and a TIM 922B. The adapter 930B may contact the heater 956B, for example. The TIM 922B may contact a portion of the component 902B, such as its outer region (e.g., outer perimeter).

Adapter 930C may be thermally coupled to another component (e.g., component 902T) or another portion of the stacked components. The adapter 930C may be thermally coupled to a heater 956T and a TIM 922C, where the TIM 922C may contact the top surface of the component 902T. In some embodiments, the first adapter 930C may be nested (fully or partially) within the second adapter 930B. The second adapter 930B may surround a plurality (two or more, such as four) sides of the first adapter 930C. The first adapter 930C and second adapter 930B may be thermally coupled, for example.

In some embodiments, the corresponding first heater 956T may be nested within the second heater 956B. The second heater 956B may surround a plurality (e.g., two or four) sides of the first heater 956B. Similarly, the first TIM layer 922C may be nested within the second TIM layer 922B. In some embodiments, as shown in the figure, a TIM layer 922C may be located between the components of the stacked components.

In some embodiments, the second adapter 930C may be located in a hollow portion of and surrounded by the first adapter 930B. In some embodiments, the first adapter 930B, the corresponding heater 956B, and/or the corresponding TIM 922B may contact most (e.g., more than 50%) of the top surface of the component 902B.

In some embodiments, thermal control of the first component 902B in the stacked components and/or its thermally-coupled (first) adapter 930B may be independent from thermal control of the second component 902T in the stacked components and/or its thermally-coupled (second) adapter 930C. In some embodiments, separate control signals may be transmitted to the corresponding heaters, cold plates, and/or force mechanisms.

The different adapters, heaters, and/or TIM layers for different portions of the stacked components may be configured accordingly. For example, the force applied by the adapter 930C to both components in the stack (component 902B and component 902T) may be at least partially transferred as force applied to the bottom component (component 902B). The adapters may apply force to different regions of component 902B, so in some embodiments, the force applied by adapter 930C may be less than the force applied by the adapter 930B. As another example, the top component 902T may a memory chip and the bottom component 902B may be a processor. The heater 956T for the top component 902T may be less powerful than the heater 956B for the bottom component 902B. Additionally or alternatively, the adapter 930C (contacting the top component 902T, or an intermediate layer such as the heater 956T and/or TIM 922C) has a lower conductivity, smaller contact area, and/or higher TIM resistance compared to the adapter 930B (contacting the bottom component 902B).

One or more (e.g., each) of the adapters, heaters, cold plates, and/or TIM layers disclosed herein of a given device may account for differences in the properties of the corresponding components, such as different heights of the components and/or arrangement of components. In the example shown in FIGS. 9A-9C, adapter 930A, adapter 930D, adapter 930E, and adapter 930F (and/or corresponding heaters, cold plates, TIM layers, or a combination thereof) may account for the height(s) of component 903B, component 903F, component 903C, and component 903G, respectively, and any associated TIM layers and/or interconnects. The adapter 930B, heater 956B, and/or TIM layer 922B may account for the height of component 902B and any associated TIM layers and/or interconnects. The adapter 930C, heater 956T, and/or TIM layer 922C may account for the total height of components 902B and 902T and any associated TIM layers and/or interconnects. One or more force mechanisms may be used to move a corresponding adapter, heater, and/or cold plate closer to a thermally-coupled component. For example, the thermal head 950 may comprise a spring 932B that moves adapter 930A closer to the component 903B and a spring 932F that moves adapter 930D and TIM 922F closer to the component 903F. Other force mechanisms may be used including, but not limited to, a lever, a force applicator, or the like.

Figure 10A:
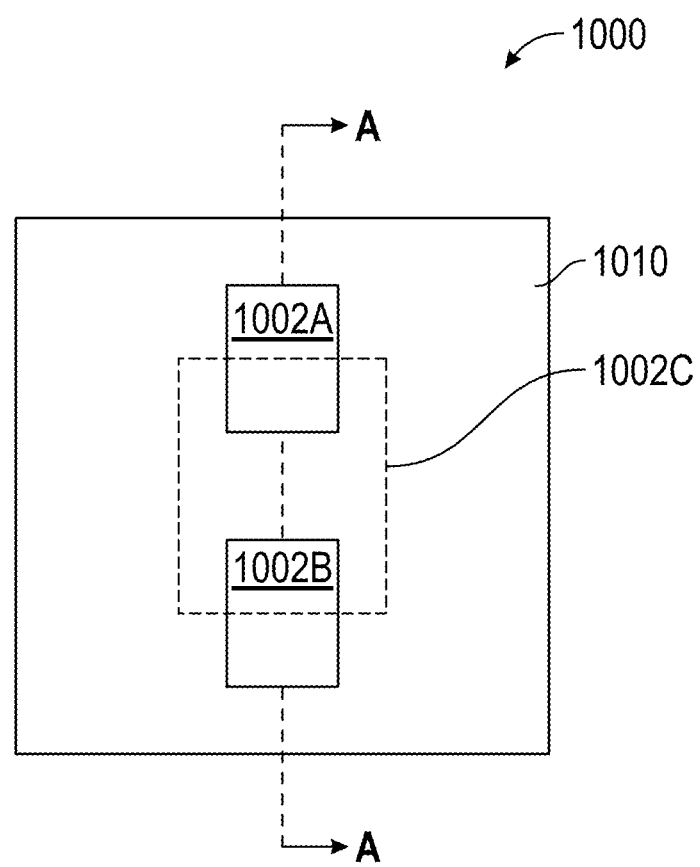
FIGS. 10A and 10B illustrate top and cross-sectional views, respectively, of an example device comprising components on a plurality of sides of a substrate, according to some embodiments.
Figure 10B:
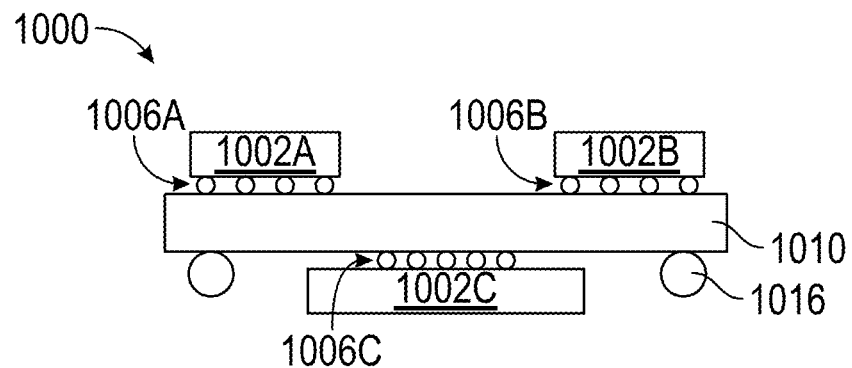

Example Thermal Head for a Device Comprising Components on a Plurality of Sides of a Substrate In some embodiments, a device under test may include component(s) and/or package(s) located on a plurality of sides of a substrate, such as device 1000 including components 1002A and 1002B located on the top side of the substrate 1010, and component 1002C located on the bottom side of the substrate 1010, as shown in the top and cross-sectional views of FIGS. 10A and 10B, respectively. The top view of FIG. 10A illustrates the outline of component 1002C (located on the bottom side of the substrate 1010). As shown in the figures, in some embodiments, the component 1002C may be located at different regions of the substrate 1010 along the x- and y-axes than the components 1002A and 1002B. In some embodiments, high-power component(s) may be located on one side of the substrate 1010 and low-power component(s) on the other side. Interconnects 1006 may be component or package interconnects that mount the components to the substrate 1010. For example, interconnects 1006A may mount the component 1002A to the top surface of the substrate 1010, interconnects 1006B may mount the component 1002B to the top surface of the substrate 1010, and interconnects 1006C may mount the component 1002C to the bottom surface of the substrate 1010. In some embodiments, the device 1000 may include interconnects 1016 to electrically couple the device 1000 to a board. The board may be a test board with a socket that engages the DUT (when the device 1000 is being tested) or a system board (when the device is being used in a package).

Although the figures illustrate chips, packages, or other components as mounted on the surface of a substrate, embodiments of the disclosure may comprise one or more components that are partially or fully enclosed within the substrate. For example, the device under test may be an embedded die or fan-out wafer-level type of package.

Figure 11:
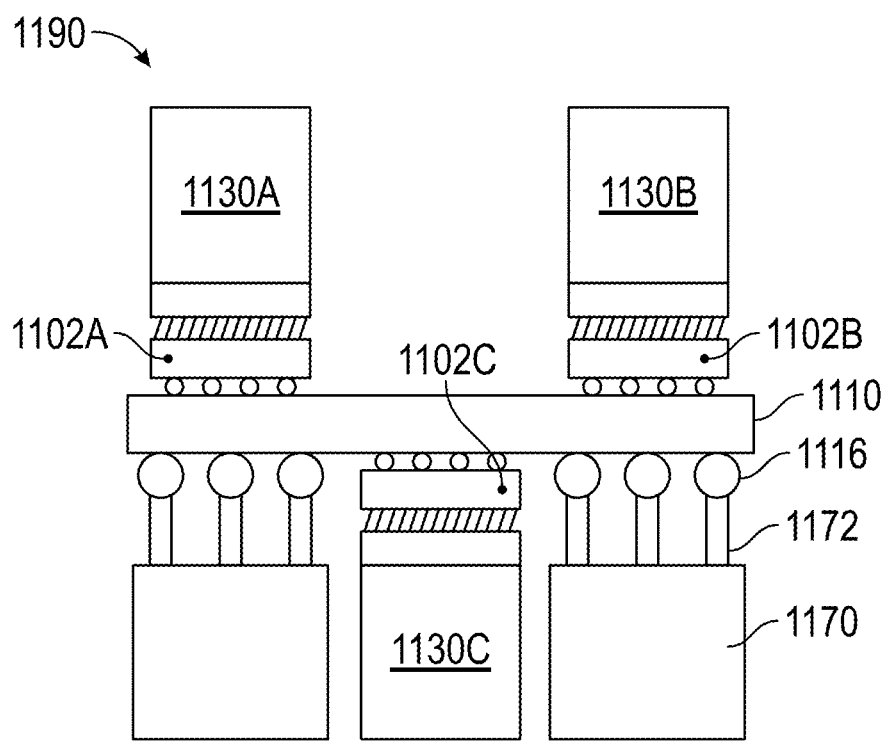
FIG. 11 illustrates a cross-sectional view of a part of a test system comprising a thermal head and a device under test having components on a plurality of sides of a substrate, according to some embodiments.

FIG. 11 illustrates a cross-sectional view of a part of a test system comprising a thermal head and a DUT having components on a plurality of sides of a substrate, according to some embodiments. The device may comprise components 1102A and 1102B located on the top side of substrate 1110 and component 1102C located on the bottom side. The thermal head may comprise a plurality of adapters 1130A, 1130B, and 1130C for independent control of components 1102A, 1102B, and 1102C, respectively.

In some embodiments, the thermal head may comprise one or more adapters configured to thermally couple to corresponding components from a plurality of sides of a substrate. The adapters 1130A and 1130B are configured to thermally couple from the top side of the substrate 1110, and the adapter 1130C is configured to couple from the bottom side of the substrate 1110. In some embodiments, the thermal coupling and/or contact of the adapters to the plurality of sides of the substrate may occur simultaneously.

Additionally or alternatively, the test system 1190 may comprise one or more mechanisms for electrically coupling to send and/or receive test signals from the device. A socket body 1170 may comprise test contact pins 1172, which may contact and/or electrically couple to the interconnects 1116 of the device. The properties of the adapters 1130A, 1130B, and 1130C may have similar properties to the adapters discussed herein.

Embodiments of the disclosure may include any of the properties including those described herein, such as (but not limited to) the device comprising additional components not shown in the figure, one or more adapters thermally coupled to a plurality of components, using a passive or active temperature control, using a passive or active force mechanism, etc.

Example Force Mechanisms

Figure 12A:
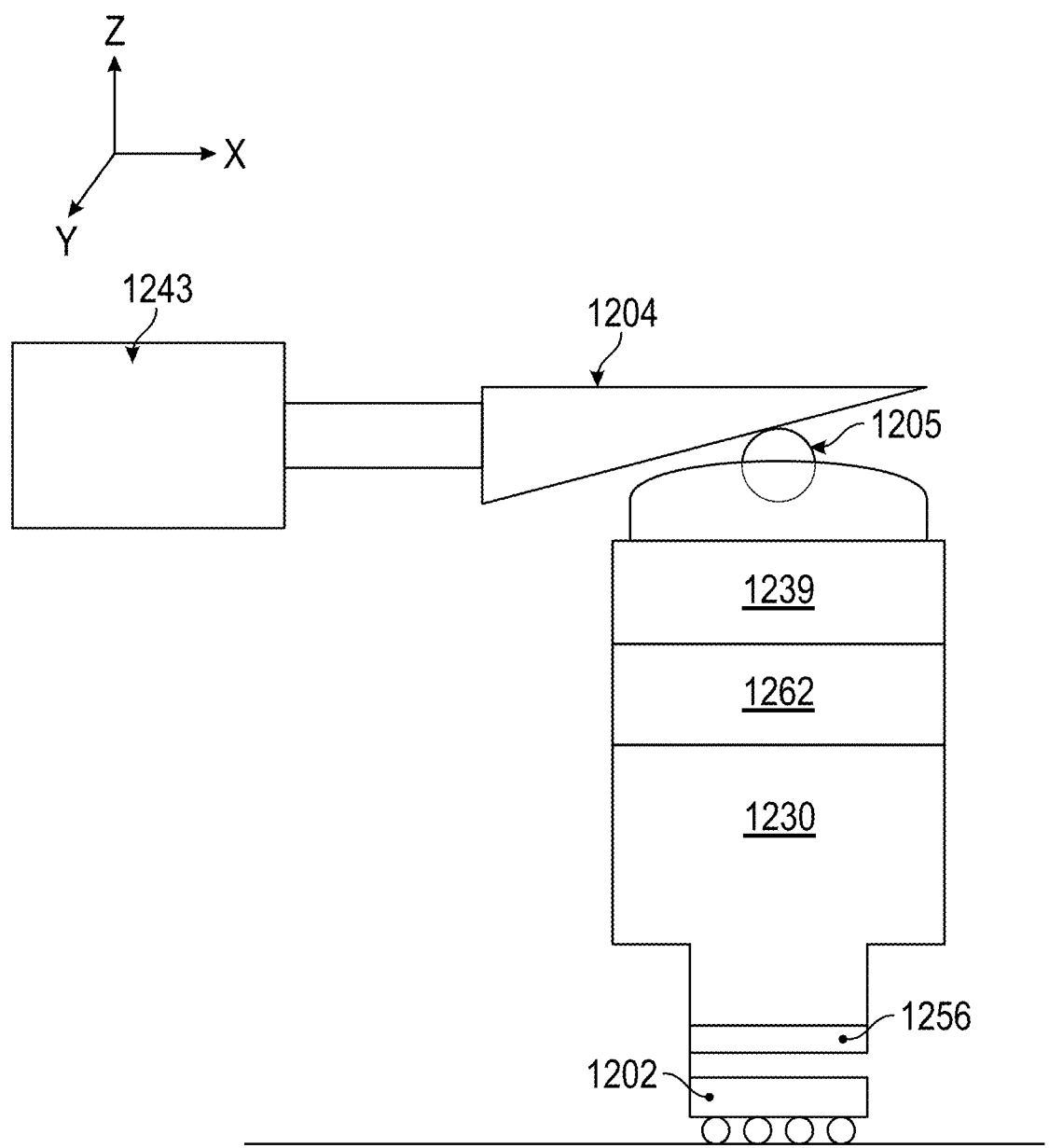
FIG. 12A illustrates an example force mechanism comprising a piston and ramp, according to some embodiments of the disclosure.

One (non-limiting) example force mechanism may comprise a piston. FIG. 12A illustrates an example piston, according to some embodiments of the disclosure. The thermal head may comprise the force mechanism, an adapter 1230, a cold plate 1262, and a heater 1256.

A piston 1243 is coupled to a ramp 1204 and a roller 1205. The piston 1243 may move in accordance with the amount of applied force. For example, movement of the piston 1243 to the right along the x-axis causes the ramp 1204 to move, applying a greater amount of force on the roller 1205, which then applies a greater amount of force on the top of the thermal head may then cause an applied force to the component 1202. The amount of applied force may be measured by a transducer 1239.

In some embodiments, the piston 1243 and at least a portion of the ramp 1204 may be located off to the side of the thermal head, creating an overall shorter profile than if the force applicator were located on top of the thermal head. The piston 1243, ramp 1204, and/or roller 1205 may be used and exchanged for a certain type of component, such as a specific SiP DUT where a greater amount of force is desired (e.g., a high pin-count or ball-count SiP). The specific SiP DUT may be tested without having to change the rest of the test system by removing any other force mechanism and replacing it. The other force mechanism may be attached or detached using screws, bolts, or attachment means.

Figure 12B:
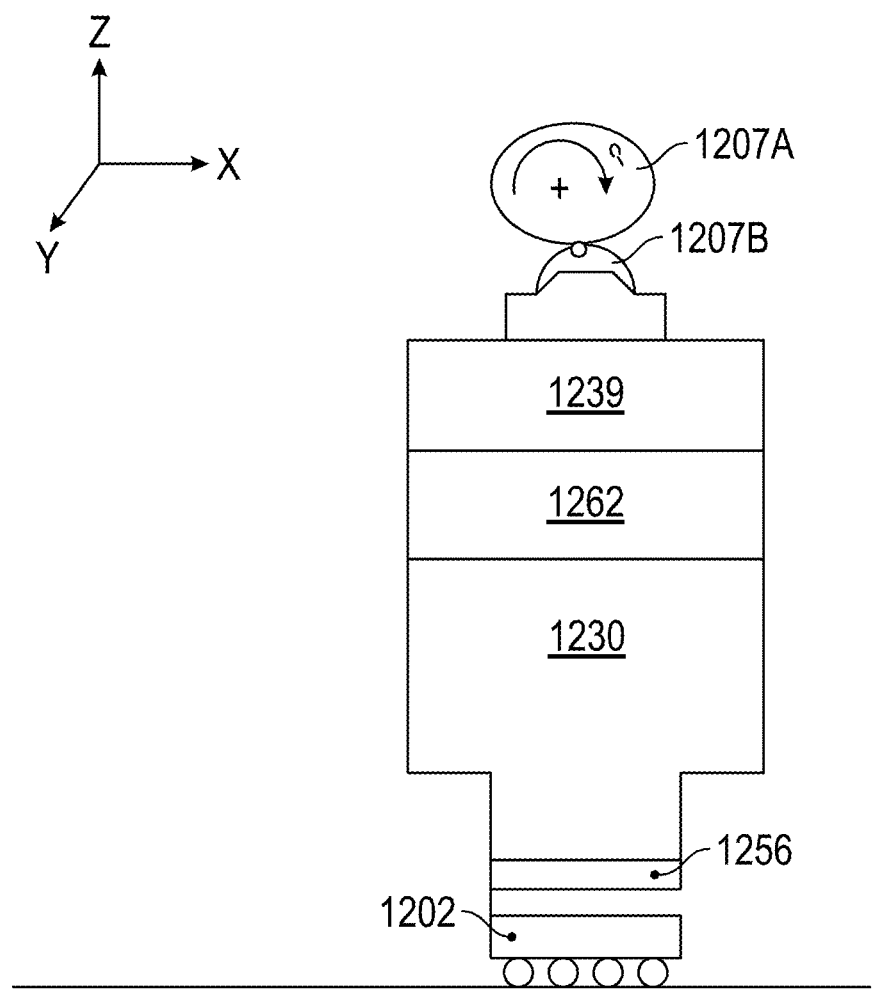
FIG. 12B illustrates an example force mechanism comprising a cam-roller, according to some embodiments of the disclosure.

Another example force mechanism comprises a cam-roller, such as the one shown in FIG. 12B. The cam-roller comprises a cam 1207A and a roller 1207B. The cam 1207A rotates in a certain direction, such as clockwise, where the rotation of the cam adjusts the amount of force to be applied via the roller 1207B in the z-direction.

In some embodiments, at least one force applied by the force mechanism(s) may be a variable force, wherein the variable force may be different at the beginning of a test (right when testing begins) and during the test, or during the test and at the end of the test (right when testing ends). In some embodiments, the variable force may be force that has been adjusted during the test. In some embodiments, the at least one force may be a fixed force that is the same at the beginning of the test and during the test, or during the test and at the end of the test. Embodiments may include other types of force mechanisms; example force mechanisms are discussed below.

Example Test Systems

Figure 13A:
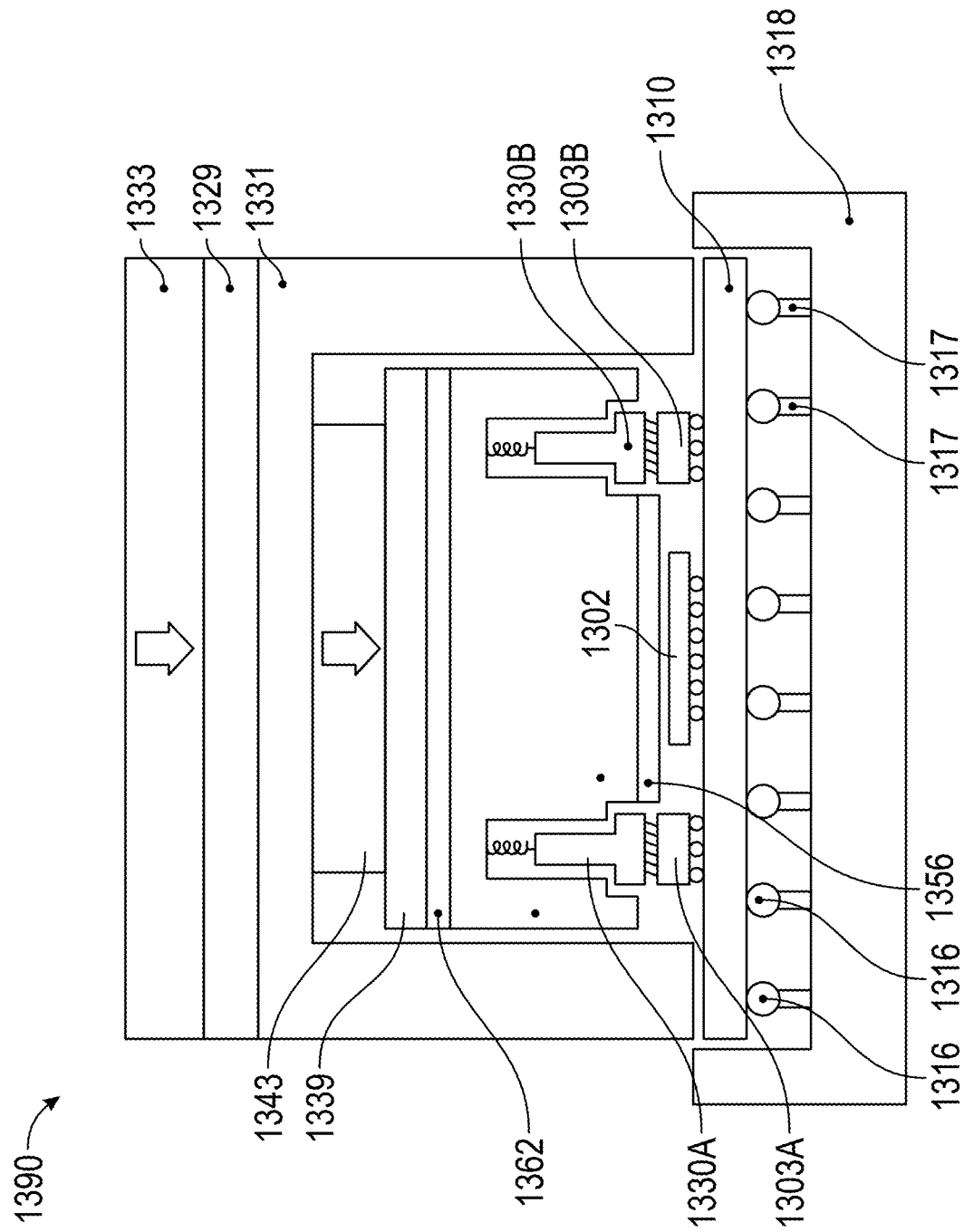
FIG. 13A illustrates a cross-sectional view of an example test system, according to some embodiments.

FIG. 13A illustrates a cross-sectional view of an example test system, according to some embodiments. The test system 1390 may comprise a thermal head and a socket. The device may comprise a plurality of components 1302, 1303A, and 1303B mounted on a substrate 1310. The substrate 1310 may comprise interconnects 1316 to electrically couple to a tester (not shown). The socket comprises a socket body 1318 comprising test contact pins 1317. Movement of the socket body 1318 towards the device or movement of the device towards the socket body 1318 may cause the test contact pins 1317 to electrically couple to the interconnects 1316.

One of the force mechanisms included in the test system 1390 may comprise a pusher 1331 and force applicator 1333 for electrically coupling the device to the test contact pins 1317 of the test system 1390 for testing (e.g., sending and/or receiving electrical signals from the tester to the device). The force applicator 1333 pushes the pusher 1331, which then pushes one or more unpopulated portions of the substrate 1310 of the device towards the socket body 1318 and corresponding test contact pins 1317. The force applicator 1333 can be any type of device that applies a force including, but not limited to, a pneumatic or hydraulic cylinder, a pneumatic or hydraulic diaphragm, a stepper motor, a linear motor, a server motor, an electroactive polymer actuator, a shape memory alloy actuator, an electromagnetic actuator, a rotary motor, an electromechanical actuator, a piezoelectric actuator, a voice coil, or other active force application device. The force applicator 1333 may apply a force between 5-300 kgf, including any force in between.

In some embodiments, the test system may comprise a transducer 1329 that measures the force being applied by the force applicator 1333 in real-time (while the force is being applied). The transducer 1329 can generate one or more force measurement signals used as feedback for a controller communicating to the force applicator 1333 to adjust the force applied such that a target force is met. The transducer 1329 can comprise a pneumatic load cell, a hydraulic load cell, an inductive load cell, a capacitive load cell, a magnetorestrictive device, a strain gauge-based sensor, a force sensitive resistor, a thin film device, a piezoelectric device, or the like. Although the figure illustrates the transducer 1329 as having a width that is the same as the pusher 1331, embodiments of the disclosure may include a transducer 1329 that has a width smaller than the width of the pusher 1331. In some embodiments, the test system 1390 may comprise one or more springs (not shown) that may be used to return the pusher 1331, transducer 1329, and/or force applicator 1333 to a home position when the force applicator 1333 is not applying a force. Additionally, in some embodiments, the test system 1390 may comprise a home sensor (not shown) used to indicate when the pusher 1331, transducer 1329, and/or force applicator 1333 are in the home position. The home position may be the position where the pusher 1331, transducer 1329, and/or force applicator 1333 are located the furthest away from the thermal head and/or not applying a force to it, for example.

Another force mechanism in the test system 1390 may comprise a force mechanism included in a thermal head. The thermal head force mechanism may comprise a force applicator 1343 for thermally coupling the device to the thermal head for thermal control of one or more components of a device under test. The force applicator 1343 may apply force to a cold plate 1362 and/or an adapter 1330C of the thermal head. The force applicator 1343 can be any type of device that applies a force including, but not limited to, a pneumatic or hydraulic cylinder, pneumatic or hydraulic diaphragm, stepper motor, linear motor, server motor, voice coil, or other active force application device. The force applicator 1343 can apply a force including, but not limited to, between 1 kgf, 2 kgf, 100 kgf, 300 kgf, or 500 kgf. The thermal head may comprise a transducer 1339 (e.g., load cell, strain gauge-based sensor, force sensitive resistor, thin film device, piezoelectric device, or the like) that measures the force being applied by the force applicator 1343 in real-time and generates one or more force measurements signals used as feedback for a controller communicating to the force applicator 1343 to adjust the applied force to meet a target force.

The force applicator 1343 may have any width, for example, the same width or smaller than the width of the adapter 1330.

As shown with the example of FIG. 13A, embodiments of the disclosure may comprise active thermal control, passive thermal control, active force control, passive force control, or a combination thereof. Active thermal control may be used to set or change the temperature of one or more components of a device to a set point temperature (or within a given range). The active thermal control may comprise a heater 1356, adapter 1330C, and/or a cold plate 1362, which change the temperature of one or more components in a device based on a thermal controller. A temperature sensor may be included for measuring the temperature of the device under test, where the measured temperature may be used as feedback by the thermal controller, heater 1356, and/or cold plate 1362.

Additionally or alternatively, the test system 1390 may comprise passive thermal control. Passive thermal control may allow one or more components in a device to change its temperature using, e.g., heat transfer. The passive thermal control may comprise one or more adapters 1330A and 1330B, which may transfer (e.g., exchange) thermal energy with one or more thermally-coupled components 1303A and 1303B, respectively. In some embodiments, the passive thermal control may allow the temperature of a thermally-coupled component to reach the temperature of the adapter 1330. The adapters 1330A and 1330B may contact the components 1303A and 1303B, respectively. In some embodiments, the adapters 1330A and 1330B (for passive thermal control) may not be thermally coupled to a heater. In some embodiments, one or more adapters 1330A and/or 1330B may not be thermally coupled to a cold plate 1362 or may be thermally coupled to a cold plate 1362 that does not include cooling channels for circulation of a cooling material.

Embodiments of the disclosure may include both active and passive thermal control. For example, as shown in the figure, the test system may comprise one or more adapters 1330A and 1330B for passive thermal control and one or more adapters, such as adapter 1330C, for active thermal control. In some embodiments, active thermal control may be used for components that have temperature set points or specific requirements, while passive thermal control may be used for other types of components (e.g., low-power components, components that do not have specific test temperature requirements, components whose performance is not sensitive to temperature, etc.).

Additionally or alternatively, any type of thermal control may be combined with any type of force control. For example, one or more adapters, such as adapters 1330A and 1330B for passive thermal control may be combined with passive force control, such as a spring, bellows, elastomer, or the like. As another example, a force applicator 1343 for active force control may be combined with a heater 1356 for active thermal control.

In some embodiments, different amounts of control may be used to account for different temperature set points or requirements, different component heights, different arrangements, etc.

Figure 13B:
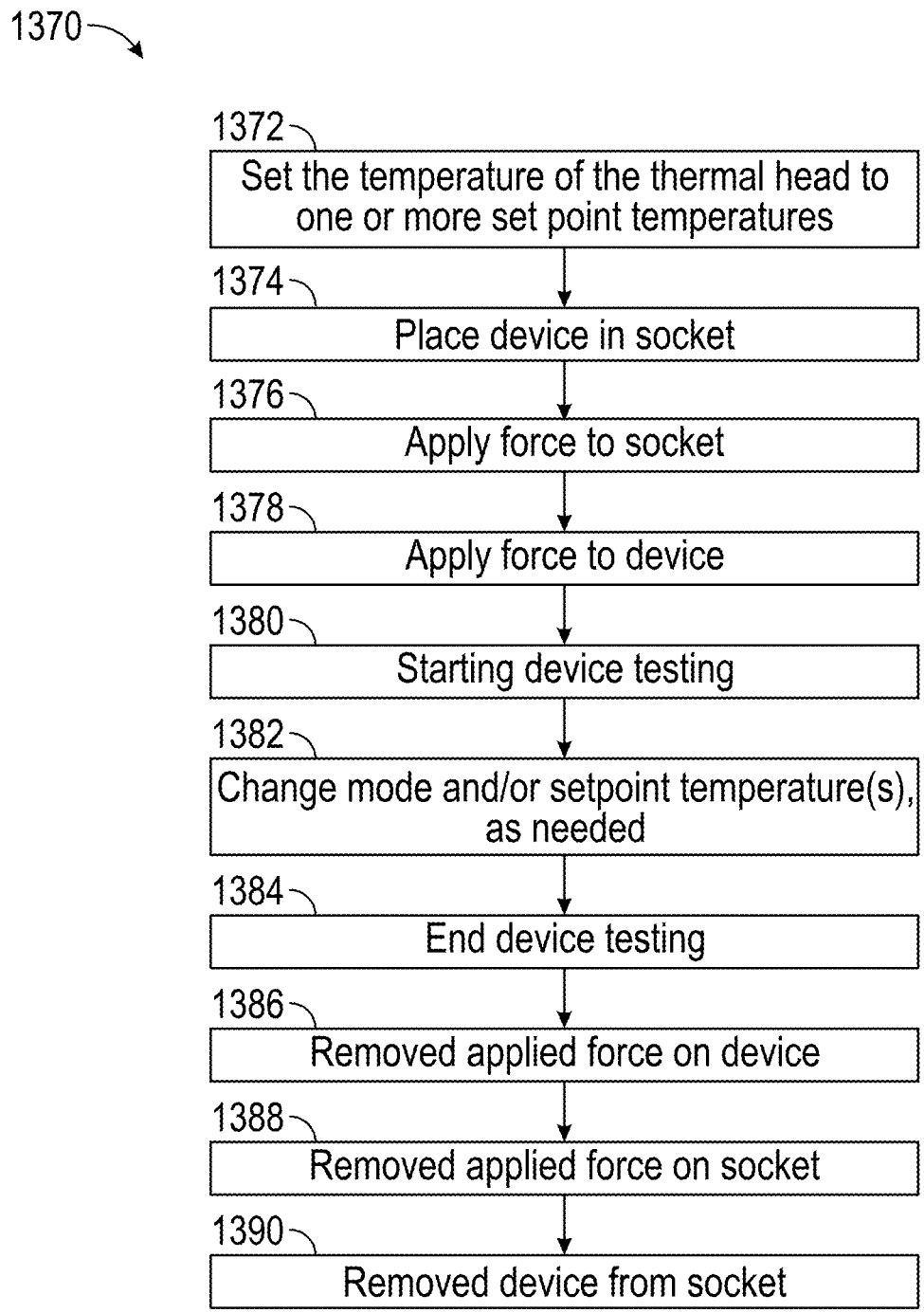
FIG. 13B illustrates a flowchart of an example method of operating the test system 1390, according to some embodiments.

FIG. 13B illustrates a flowchart of an example method of operating the test system 1390, according to some embodiments. Process 1370 comprises step 1372 where the test system 1390 sets the temperature of the thermal head to one or more set point temperatures. The ramp rate of the temperature may be as fast as possible or may be predetermined, for example. In step 1374, the test system places the device to be tested in a socket. The temperature of the thermal head may reach the one or more set point temperatures before or after the device is placed in the socket.

In step 1376, a first force may be applied to the device for electrically coupling the device to the socket. A transducer may measure the amount of force applied. If the measured force does not meet a threshold force, then the test system may cease process 1370. Otherwise, in step 1378, a second force may be applied to the device in order to bring the adapter(s)/heater(s)/TIM(s) in contact with the individual chips, e.g., the force need to thermally couple the thermal head to the device. A transducer measures the amount of force applied to the device, and ends the process if it does not meet a threshold force.

If the amount of first force and the amount of second force applied to the device meet their respective threshold forces, then the test system 1390 starts device testing (step 1380). In some embodiments, the test system 1390 starts device testing in response to a start-of-test signal transmitted from one or more controllers (e.g., a handler, a thermal controller). During the test, the test system 1390 may optionally send one or more signals to the controller to change modes and/or set point temperature(s) (step 1382). Example modes may comprise, but are not limited to, measuring the heater temperature, measuring the DUT temperature, etc. The mode may be changed in accordance with the examples of the disclosure.

In step 1384, the test system 1390 completes the device testing and sends an end-of-test signal to the controller(s). The second force applied on the device may be removed (step 1386), and then the first force applied on the device may be removed (step 1388). In some embodiments, process 1370 may not proceed to step 1388 until the test system 1390 verifies that the second force applied on the device has been removed (in step 1386). In some embodiments, process 1370 may not proceed to step 1390 until the test system 1390 verifies that the first force applied on the device has been removed (in step 1388). In step 1390, the device may be removed from the socket. One or more steps of process 1370 may be repeated, e.g., to test other devices.

Figure 14:
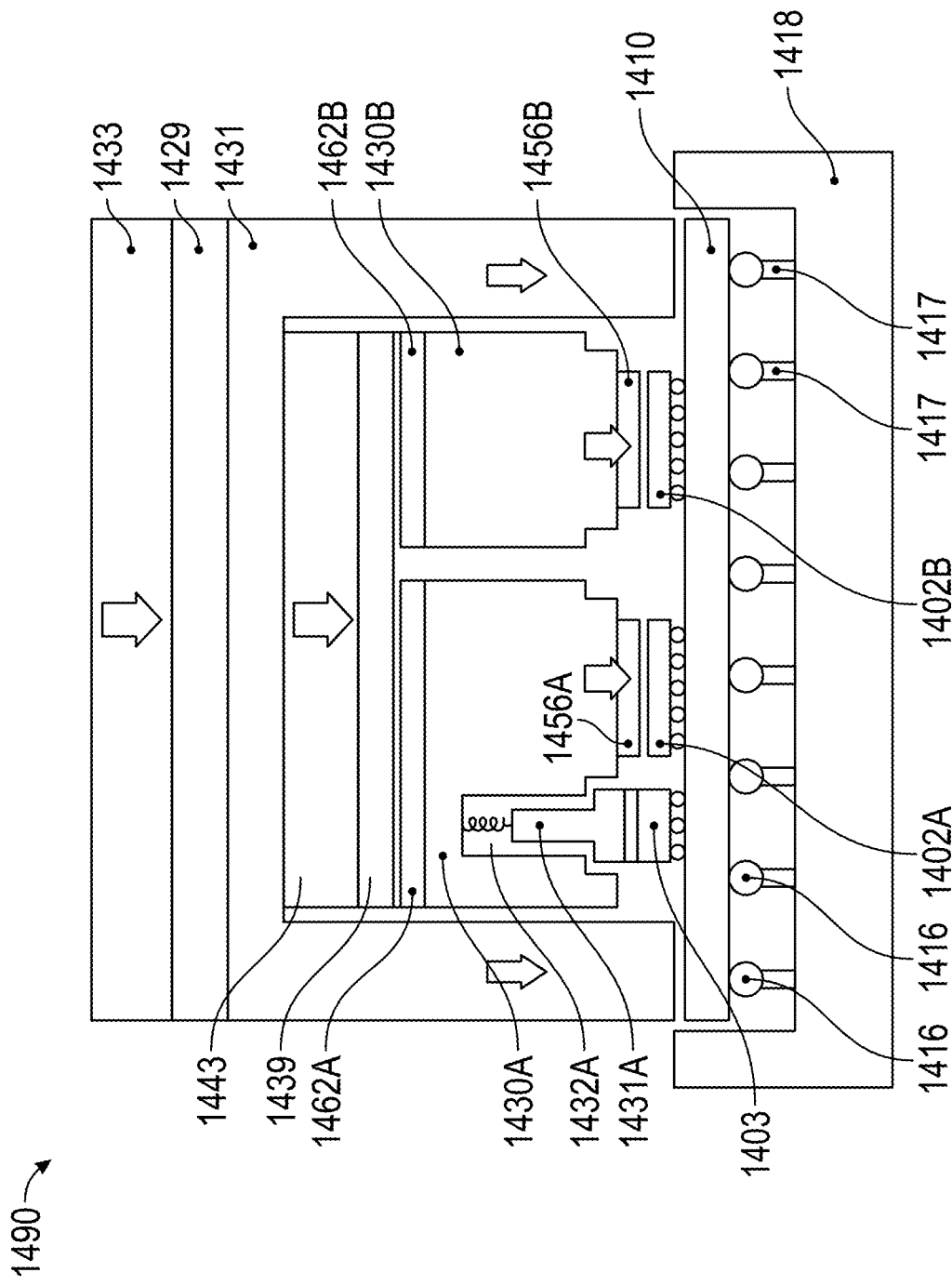
FIG. 14 illustrates an example active thermal control for a plurality of components of a device, according to some embodiments.
Figure 15:
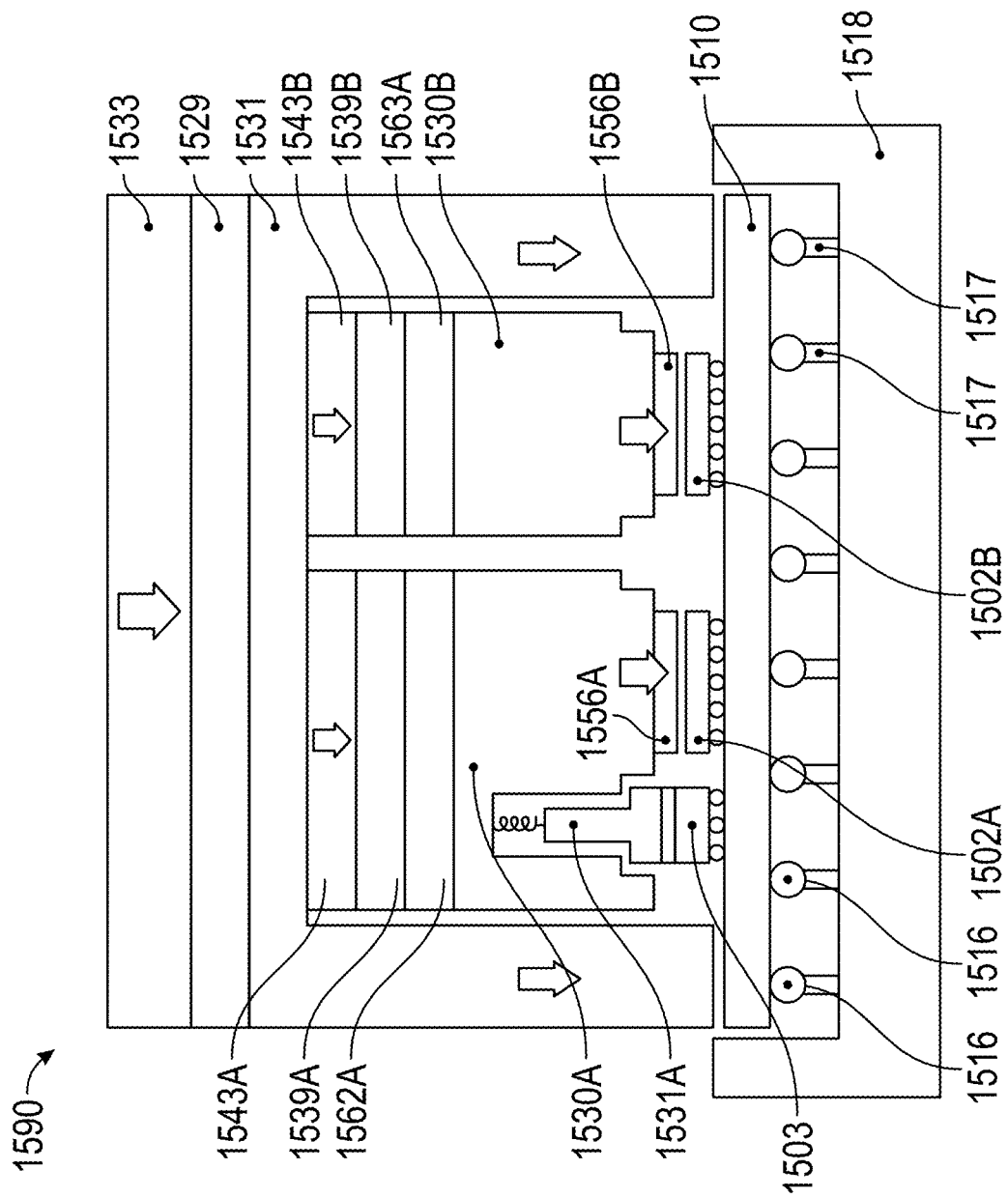
FIG. 15 illustrates an example thermal head and socket, according to some embodiments.

Embodiments of the disclosure may comprise active thermal control for a plurality of components of a device, as shown in FIG. 14. The test system 1490 may comprise a thermal head and a socket. In some embodiments, the thermal head comprises a force mechanism. The force mechanism (e.g., pusher 1431, transducer 1429, force applicator 1433, force applicator 1443, transducer 1439, etc.) and socket (comprising socket body 1418 and test contact pins 1417) may have one or more properties similar to the force mechanisms and socket discussed herein (e.g., described in the context of FIGS. 13 and 15). The device may comprise a plurality of components 1403, 1402A, and 1402B mounted on a substrate 1410. The substrate 1410 may comprise interconnects 1416 for receiving and/or transmitting test signals to and/or from a tester.

The test system 1490 may comprise a plurality of adapters 1430A and 1430B thermally coupled to component 1402A and component 1402B, respectively. The plurality of adapters 1430 may be thermally coupled to different heaters 1456; adapter 1430A is thermally coupled to heater 1456A, while adapter 1430B is thermally coupled to heater 1456B. The plurality of adapters 1430 may be thermally coupled to different cold plates 1462; adapter 1430A is thermally coupled to cold plate 1462A, while adapter 1430B is thermally coupled to cold plate 1462B. A thermal controller may be configured to independently control the temperatures of the component 1402A and component 1402B by way of the respective adapter 1430A or 1430B, heater 1456A or 1456B, and/or cold plate 1462A or 1462B. These may be two non-limiting examples of active thermal control.

Embodiments of the disclosure may further comprise passive thermal control. The thermal energy dissipated from the component 1403 may be allowed to transfer (e.g., dissipate) heat to adapter 1430C.

Additionally or alternatively, the thermal head of FIG. 14 may comprise both active and passive force control. For active force control, a force applicator 1443 applies force to the adapters 1430A and 1430B, which then applies force to components 1402A and 1402B. The amount of force applied, as measured by the transducer 1439, may be controlled by a controller that determines the force to be applied by the force applicator 1443. In some embodiments, the force control may not be independent for each adapter or component, such as the force applicator 1443 applying force to at least two adapters and/or components.

Embodiments of the disclosure my further comprise passive force control. The spring 1432A may apply a force to the adapter 1430C, which then applies force to the component 1403. The amount of force applied may not be adjustable and may be based on the properties of the spring 1432A.

Embodiments of the disclosure may comprise active force control for a plurality of components, according to some embodiments of the disclosure. The test system 1590 of FIG. 15 may comprise a thermal head and a socket. The force mechanisms (e.g., pusher 1531, transducer 1529, force applicator 1533, force applicators 1543A and 1543B, transducer 1539A and 1539B), other parts of the thermal head (e.g., cold plates 1562A and 1562B, adapters 1530A, 1530B, and 1530C, heaters 1556A and 1556B), socket (comprising socket body 1518 and test contact pins 1517), and parts of the device (e.g., interconnects 1516, components 1502A, 1502B, and 1503, substrate 1510) may have one or more properties similar to the force mechanisms, parts of the socket, and parts of the device discussed herein (e.g., described in the context of FIGS. 13A and 14).

Example Controller

Figure 16:
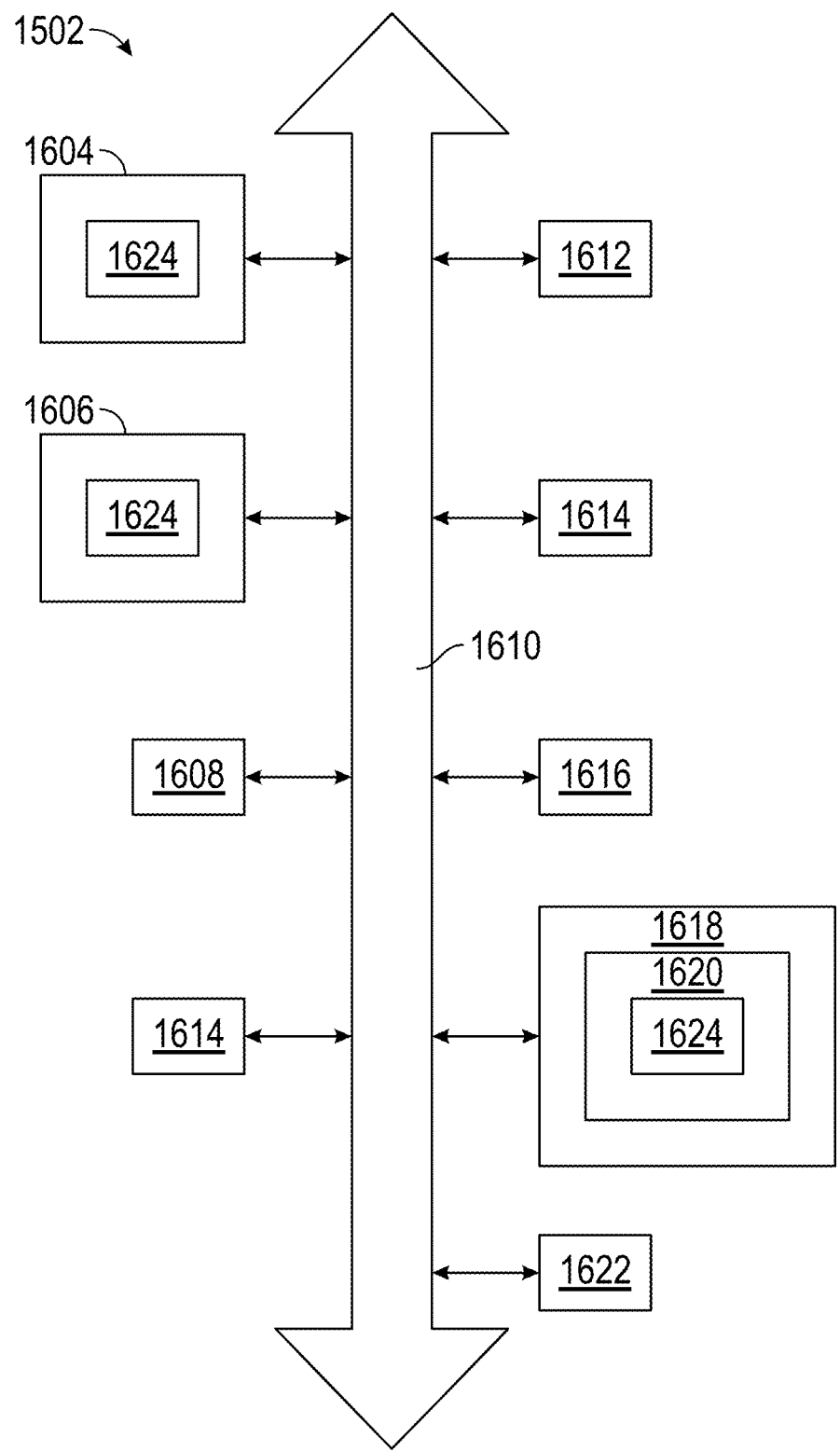
FIG. 16 illustrates a block diagram of an exemplary computer used for one or more controllers, according to embodiments of the disclosure.

As discussed above, one or more controllers may be used for the test systems and/or thermal heads of the disclosures. FIG. 16 illustrates a block diagram of an exemplary computer 1602 used for one or more controllers, according to embodiments of the disclosure. The computer may be a machine, within which a set of instructions, causes the machine to perform any one of the methodologies discussed herein, may be executed, according to embodiments of the disclosure. In some embodiments, the machine can operate as a standalone device or may be connected (e.g., networked) to other machines. In a networked configuration, the machine may operate in the capacity of a server or a client machine in a server-client network environment, or as a peer machine in a peer-to-peer (or distributed) network environment. The machine can be a personal computer (PC), a tablet PC, a set-top box (STB), a personal digital assistant (PDA), a cellular telephone, a web appliance, a network router, a switch or bridge, or any machine capable of executing a set of instructions (sequential or otherwise) that specify actions to be taken by that machine. A mobile device may include an antenna, a chip for sending and receiving radio frequency transmissions and wireless communications, and a keyboard. Further, while only a single machine is illustrated, the term "machine" shall also be taken to include any collection of machines that individually or jointly execute a set (or multiple sets) of instructions to perform any one of the methodologies discussed herein.

The exemplary computer 1602 includes a processor 1604 (e.g., a central processing unit (CPU), a graphics processing unit (GPU), or both), a memory 1606 (e.g., read-only memory (ROM), flash memory, dynamic random access memory (DRAM) such as synchronous DRAM (SDRAM), etc.), and a static memory 1608 (e.g., static random access memory (SRAM), etc.), which can communicate with each other via a bus 1610.

The computer 1602 may further include a video display 1612 (e.g., a liquid crystal display (LCD) or light emitting diode (LED) display). The computer 1602 also includes an alpha-numeric input device 1614 (e.g., a keyboard), a cursor control device 1616 (e.g., a mouse), a disk drive unit 1618, a signal generation device, a network interface device 1622, and one or more wireless interface devices.

The computer 1602 may also include other inputs and outputs, including digital I/O and/or analog I/O. For example, the inputs and outputs may communicate with external devices, such as chillers, pressure controllers, force controllers, flow value controllers, etc., using any type of communication protocol.

The drive unit 1618 includes a machine-readable medium 1620 on which is stored one or more sets of instructions 1624 (e.g., software) embodying any one or more of the methodologies or functions described herein. The software may also reside, completely or at least partially, within the main memory 1606 and/or within the processor 1604 during execution thereof by the computer 1602, the main memory 1606 and the processor 1604 also constituting machine-readable media. The software may further be transmitted or received over a network via the network interface device 1622 and/or a wireless device.

While the machine-readable medium 1620 is shown in an exemplary embodiment to be a single medium, the term "machine-readable medium" should be taken to include a single medium or multiple media (e.g., a centralized or distributed database and/or associated caches and servers) that store the one or more sets of instructions. The term "machine-readable medium" shall also be taken to include any medium that is capable of storing, encoding, or carrying a set of instructions for execution by the machine and that cause the machine to perform any one or more of the methodologies of the present invention. The term "machine-readable medium" shall accordingly be taken to include, but not be limited to, solid-state memories, optical and magnetic media, and carrier wave signals.

Although examples of this disclosure have been fully described with reference to the accompanying drawings, it is to be noted that various changes and modifications will become apparent to those skilled in the art. Such changes and modifications are to be understood as being included within the scope of examples of this disclosure as defined by the appended claims.

The invention claimed is:

1. A thermal control system for thermally controlling one or more devices under test, comprising:
   a thermal head for controlling one or more temperatures of the one or more devices under test, the thermal head comprising:
      a plurality of adapters thermally coupled to one or more components of the one or more devices under test, wherein the plurality of adapters comprises a first adapter and a second adapter, and movement of the first adapter is independent from movement of the second adapter; and
   a controller configured to independently control one or more properties of the plurality of adapters.

2. The thermal control system of claim 1, wherein the one or more properties comprise temperature or force.

3. The thermal control system of claim 1, wherein the plurality of adapters comprises a first adapter having a first height and a second adapter having a second height.

4. The thermal control system of claim 1, wherein the plurality of adapters comprises a first adapter having a first thermal mass and a second adapter having a second thermal mass.

5. The thermal control system of claim 1, wherein the plurality of adapters comprises a first adapter having a first surface area thermally coupled to corresponding one or more components and a second adapter having a second surface area thermally coupled to corresponding one or more components.

6. The thermal control system of claim 1, wherein at least two of the plurality of adapters are configured to thermally couple to the one or more components on the same side of a substrate of the one or more devices under test.

7. The thermal control system of claim 1, wherein at least two of the plurality of adapters are configured to thermally couple to the one or more components on different sides of a substrate of the one or more devices under test.

8. The thermal control system of claim 1, wherein the plurality of adapters comprises a first adapter nested within a second adapter.

9. The thermal control system of claim 8, wherein the plurality of adapters comprises a first adapter and a second adapter, wherein the thermal head further comprises:
a first heater thermally coupled to the first adapter and a second heater thermally coupled to the second adapter, wherein the first heater is nested within the second heater.

10. The thermal control system of claim 8, wherein the plurality of adapters comprises a first adapter and a second adapter, wherein the thermal head further comprises:
a first thermal interface material layer thermally coupled to the first adapter and a second thermal interface material layer thermally coupled to the second adapter, wherein the first thermal interface material layer is nested within the second thermal interface material layer.

11. The thermal control system of claim 8, wherein the first adapter is thermally coupled to a first component and the second adapter is thermally coupled to a second component, and wherein movement of the second component is not independent from movement of the first component.

12. The thermal control system of claim 1, wherein the one or more components comprise stacked components.

13. The thermal control system of claim 12, wherein the first adapter is thermally coupled to a first component of the stacked components and the second adapter is thermally coupled to a second component of the stacked components, wherein a height of the first adapter is less than a height of the second adapter.

14. The thermal control system of claim 12, wherein the first adapter is thermally coupled to a first component of the stacked components and the second adapter is thermally coupled to a second component of the stacked components, wherein a force applied by the first adapter is less than a force applied by the second adapter.

15. The thermal control system of claim 1, wherein the thermal head further comprises:
one or more heaters thermally coupled to at least one of the one or more components, wherein the one or more heaters are configured to heat the at least one component.

16. The thermal control system of claim 15, wherein the one or more heaters comprise a first heater coupled to a first adapter and a second heater coupled to a second adapter, wherein movement of the first heater is independent from movement of the second heater.

17. The thermal control system of claim 15, wherein at least one of the one or more heaters contacts at least one of the plurality of adapters.

18. The thermal control system of claim 15, wherein the one or more heaters are independently controlled.

19. The thermal control system of claim 1, wherein the thermal head further comprises:
one or more cold plates thermally coupled to at least one of the plurality of adapters, wherein the one or more cold plates are configured to cool the at least one adapter.

20. The thermal control system of claim 19, wherein the one or more cold plates comprise a first cold plate coupled to a first adapter and a second cold plate coupled to a second adapter, wherein movement of the first cold plate is independent from movement of the second cold plate.

21. The thermal control system of claim 19, wherein at least one of the one or more cold plates contacts at least one of the plurality of adapters.

22. The thermal control system of claim 21, wherein the one or more cold plates are independently controlled.

23. The thermal control system of claim 1, wherein the thermal head further comprises:
one or more force mechanisms configured to apply one or more forces to at least one of the one or more components.

24. The thermal control system of claim 23, wherein the one or more force mechanisms are independently controlled.

25. The thermal control system of claim 1, wherein at least two of the one or more components have different set point temperatures.

26. The thermal control system of claim 1, wherein at least two of the one or more components have different amounts of power dissipation.

27. The thermal control system of claim 1, wherein at least two of the one or more components are tested with different applied forces.

28. The thermal control system of claim 1, wherein at least two of the one or more components have different heights.

29. The thermal control system of claim 1, wherein at least one of the plurality of adapters is thermally coupled to at least two of the one or more components.

30. The thermal control system of claim 1, wherein the one or more components are part of a single device under test.

* * * * *